US010061139B2

(12) United States Patent
Li et al.

(10) Patent No.: US 10,061,139 B2
(45) Date of Patent: Aug. 28, 2018

(54) OPTICAL DEVICES BASED ON NON-PERIODIC SUB-WAVELENGTH GRATINGS

(71) Applicant: Hewlett Packard Enterprise Development LP, Houston, TX (US)

(72) Inventors: Jingjing Li, Palo Alto, CA (US); Nate Quitoriano, Palo Alto, CA (US); David A. Fattal, Palo Alto, CA (US); Raymond G. Beausoleil, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 661 days.

(21) Appl. No.: 14/596,790

(22) Filed: Jan. 14, 2015

(65) Prior Publication Data
US 2015/0192782 A1    Jul. 9, 2015

Related U.S. Application Data

(63) Continuation of application No. 13/259,886, filed as application No. PCT/US2010/022647 on Jan. 29, 2010, now Pat. No. 8,952,403.

(51) Int. Cl.
G02B 27/42 (2006.01)
G02B 5/18 (2006.01)
(Continued)

(52) U.S. Cl.
CPC ....... *G02B 27/4216* (2013.01); *G02B 5/1809* (2013.01); *G02B 5/1861* (2013.01);
(Continued)

(58) Field of Classification Search
CPC ............ G02B 27/4216; G02B 27/4272; G02B 5/1895; G02B 5/1809; G02B 5/1861;
(Continued)

(56) References Cited

U.S. PATENT DOCUMENTS 4,790,024 A    12/1988   Peppers et al.
4,829,172 A     5/1989   Miller
(Continued)

FOREIGN PATENT DOCUMENTS

CN    2571034       9/2003
CN    1507684 A    6/2004
(Continued)

OTHER PUBLICATIONS

Berseth, C.A. et al., "Vertical cavity surface emitting lasers incorporating structured mirrors patterned by electron-beam lithography", J. Vac. Sci. Technol. B, Nov. 199.
(Continued)

*Primary Examiner* — Georgia Y Epps
*Assistant Examiner* — Don Williams
(74) *Attorney, Agent, or Firm* — Tarolli, Sundheim, Covell & Tummino L.L.P.

(57) ABSTRACT

Various embodiments of the present invention are directed to optical devices comprising planar lenses. In one aspect, an optical device includes two or more planar lenses, and one or more dielectric layers. Each planar lens includes a non-periodic, sub-wavelength grating layer, and each dielectric layer is disposed adjacent to at least one planar lens to form a solid structure. The two or more planar lenses are substantially parallel and arranged to have a common optical axis so that light transmitted through the optical device substantially parallel to the optical axis is refracted by the two or more planar lenses.

18 Claims, 21 Drawing Sheets

(51) Int. Cl.
*H01L 27/146* (2006.01)
*G02B 15/14* (2006.01)
*G02B 25/00* (2006.01)

(52) U.S. Cl.
CPC ...... *G02B 27/4272* (2013.01); *H01L 27/1462* (2013.01); *H01L 27/14625* (2013.01); *H01L 27/14629* (2013.01); *G02B 5/1895* (2013.01); *G02B 15/14* (2013.01); *G02B 25/001* (2013.01)

(58) Field of Classification Search
CPC ... G02B 15/14; G02B 25/001; H01L 27/1462; H01L 27/14629
See application file for complete search history.

(56) References Cited

U.S. PATENT DOCUMENTS

| | | | |
|---|---|---|---|
| 5,140,149 A | 8/1992 | Sakata et al. | |
| 5,323,268 A * | 6/1994 | Kikuchi | G02B 3/005 359/653 |
| 5,726,805 A | 3/1998 | Kaushik et al. | |
| 5,742,433 A | 4/1998 | Shiono et al. | |
| 5,978,139 A | 11/1999 | Hatakoshi et al. | |
| 6,181,478 B1 | 1/2001 | Mandella | |
| 6,195,381 B1 | 2/2001 | Botez et al. | |
| 6,417,968 B1 | 7/2002 | Staub et al. | |
| 6,590,267 B1 | 7/2003 | Goodwin-Johansson et al. | |
| 6,683,898 B2 | 1/2004 | Ostergaard et al. | |
| 6,697,405 B2 | 2/2004 | Kitatani et al. | |
| 6,707,548 B2 | 3/2004 | Kreimer et al. | |
| 6,741,624 B2 | 5/2004 | Mears et al. | |
| 6,785,320 B1 | 8/2004 | Amos et al. | |
| 6,818,959 B2 | 11/2004 | Montelius et al. | |
| 6,894,836 B2 | 5/2005 | Christenson | |
| 6,914,231 B1 | 7/2005 | Stone | |
| 7,096,498 B2 | 8/2006 | Judge | |
| 7,106,920 B2 | 9/2006 | Liu | |
| 7,173,764 B2 | 2/2007 | Carr et al. | |
| 7,180,930 B2 | 2/2007 | Takaki et al. | |
| 7,221,691 B2 | 5/2007 | Johnson et al. | |
| 7,302,130 B2 | 11/2007 | Stone | |
| 7,304,781 B2 | 12/2007 | Chang-Hasnain et al. | |
| 7,386,205 B2 | 6/2008 | Wang et al. | |
| 7,680,371 B2 | 3/2010 | Cheben et al. | |
| 7,693,205 B2 | 4/2010 | Uchida | |
| 9,093,819 B2 | 7/2015 | Fattal et al. | |
| 2002/0073338 A1 | 6/2002 | Burrows et al. | |
| 2002/0080493 A1 | 6/2002 | Tsai et al. | |
| 2002/0149822 A1 | 10/2002 | Stroud | |
| 2002/0196428 A1 | 12/2002 | Yamagata et al. | |
| 2003/0048824 A1 | 3/2003 | Shinagawa et al. | |
| 2003/0206681 A1 | 11/2003 | Polonskiy et al. | |
| 2003/0227628 A1 | 12/2003 | Kreimer | |
| 2003/0235229 A1 | 12/2003 | Deng et al. | |
| 2003/0235370 A1 | 12/2003 | Taillaert et al. | |
| 2004/0140428 A1 | 7/2004 | Ionescu et al. | |
| 2005/0013334 A1 | 1/2005 | Watanabe et al. | |
| 2006/0042483 A1 | 3/2006 | Work et al. | |
| 2006/0076697 A1 | 4/2006 | Lee | |
| 2006/0109540 A1 | 5/2006 | Kueks et al. | |
| 2006/0126183 A1 | 6/2006 | Hasman | |
| 2006/0187987 A1 | 8/2006 | Nomoto et al. | |
| 2006/0232776 A1 | 10/2006 | Hairston et al. | |
| 2006/0245464 A1 | 11/2006 | Hori et al. | |
| 2006/0262250 A1 | 11/2006 | Hobbs | |
| 2006/0273284 A1 | 12/2006 | Hirose | |
| 2006/0284052 A1 | 12/2006 | Toshikiyo et al. | |
| 2007/0013905 A1 | 1/2007 | Brown | |
| 2007/0115553 A1 | 5/2007 | Chang-Hasnain et al. | |
| 2007/0153860 A1 | 7/2007 | Chang-Hasnain et al. | |
| 2007/0165214 A1 | 7/2007 | Wu et al. | |
| 2007/0201527 A1 | 8/2007 | Hori et al. | |
| 2008/0084616 A1 | 4/2008 | Katakura | |
| 2008/0267236 A1 | 10/2008 | Sigalas et al. | |
| 2008/0317406 A1 | 12/2008 | Santori et al. | |
| 2009/0051930 A1 | 2/2009 | Moulin et al. | |
| 2009/0097122 A1 | 4/2009 | Niv | |
| 2009/0116790 A1 | 5/2009 | Mossberg et al. | |
| 2009/0196319 A1 | 8/2009 | Hori et al. | |
| 2009/0323195 A1 | 12/2009 | Hembree et al. | |
| 2009/0324248 A1 | 12/2009 | Shiraki | |
| 2010/0128749 A1 | 5/2010 | Amann et al. | |
| 2010/0279446 A1 | 11/2010 | Henrichs | |
| 2010/0316083 A1 | 12/2010 | Chang-Hasnain et al. | |
| 2011/0096394 A1 | 4/2011 | Liu | |
| 2011/0188119 A1 | 8/2011 | Mathai et al. | |
| 2012/0027339 A1 | 2/2012 | Mathai et al. | |
| 2012/0105962 A1 | 5/2012 | Fattal et al. | |
| 2012/0194911 A1 | 8/2012 | Li et al. | |

FOREIGN PATENT DOCUMENTS

| | | |
|---|---|---|
| CN | 1595221 | 3/2005 |
| CN | 1916668 | 2/2007 |
| EP | 0534711 A1 | 3/1993 |
| JP | 11-095017 | 4/1999 |
| JP | 2001033612 A | 2/2001 |
| JP | 2009188153 A | 8/2009 |
| KR | 10-20080009280 | 1/2008 |
| KR | 10-20080099172 | 11/2008 |
| TW | 200811593 | 5/1996 |
| TW | 200927835 | 12/1996 |
| WO | WO-2006125196 | 11/2006 |
| WO | WO-2011008216 | 1/2011 |
| WO | WO-2012105945 | 8/2012 |

OTHER PUBLICATIONS

Chang-Hasnain, C. J. et al., "Tunable VCSEL Using High Contrast Grating", OSA CLEO2009, May 2009. (200903198).

Chang-Hasnain, C.J. et al., "High-Contrast Grating VCSELs," Selected Topics in Quantum Electronics, IEEE Journal of 15.3, May/Jun. 2009, pp. 869-878.

Christensen, et al., "Low-distortion hybrid optical shuffle concept", Optics Letters, Feb. 1, 1999, pp. 169-171, vol. 24, No. 3.

European Search Report (Supplementary), dated Apr. 26, 2013, EP Application No. 09849901.5.

Extended European Search Report received in EP Application No. 09847443.0, dated Nov. 27, 2015, 7 pages.

Fattal, David, et al., "Flat Dielectric Grating Reflectors with High Focusing Power", 8 pages, <http://arvix.org/PScache/arxiv/pdf/1 001/1 001.3711v1.pdf, Jan. 21, 2010.

Hewlett-Packard Development Company, L.P., "Non-Periodic Grating Reflectors with Focusing Power and Methods for Fabricating", Application No. PCT/US09/51026, Filed Jul. 17, 2009.

Hewlett-Packard Development Company, LP., "Optical Devices Based on Diffraction Gratings", Application No. PCT/US09/58006, Filed Sep. 23, 2009.

International Search Report and Written Opinion, dated Aug. 2, 2011. PCT Application No. PCT/US2010/054740.

International Search Report and Written Opinion, dated Sep. 27, 2010. PCT Application No. PCT/US2010/022632.

International Search Report, dated Apr. 20, 2010, PCT Application No. PCT/US2009/051026. (200903198).

International Search Report, dated Sep. 28, 2011, PCT Application No. PCT/US2011/023219 (201005075).

International Search Report, dated May 31, 2010, PCT Application No. PCT/US2009/058006, Filed Sep. 23, 2009.

Marino, Francesco, "Single Mode Operation and Transverse Mode Control in VCSELs Induced by Frequency Selective Feedback", May 21, 2003, IEEE, Dept. de Fisica Interdisc.

Srinivasan, Kartik, et al.. "Fabrication-tolerant high quality factor photonic crystal microcavities." arXiv preprint physics/0312060 (2003).

(56) References Cited

OTHER PUBLICATIONS

Zhou, Ye, "Transverse Mode Control in High-Contrast Subwavelength Grating VCSEL", 2 pages, Department of Electrical Engineering and Computer Sciences, May 6-11, 2007.

* cited by examiner

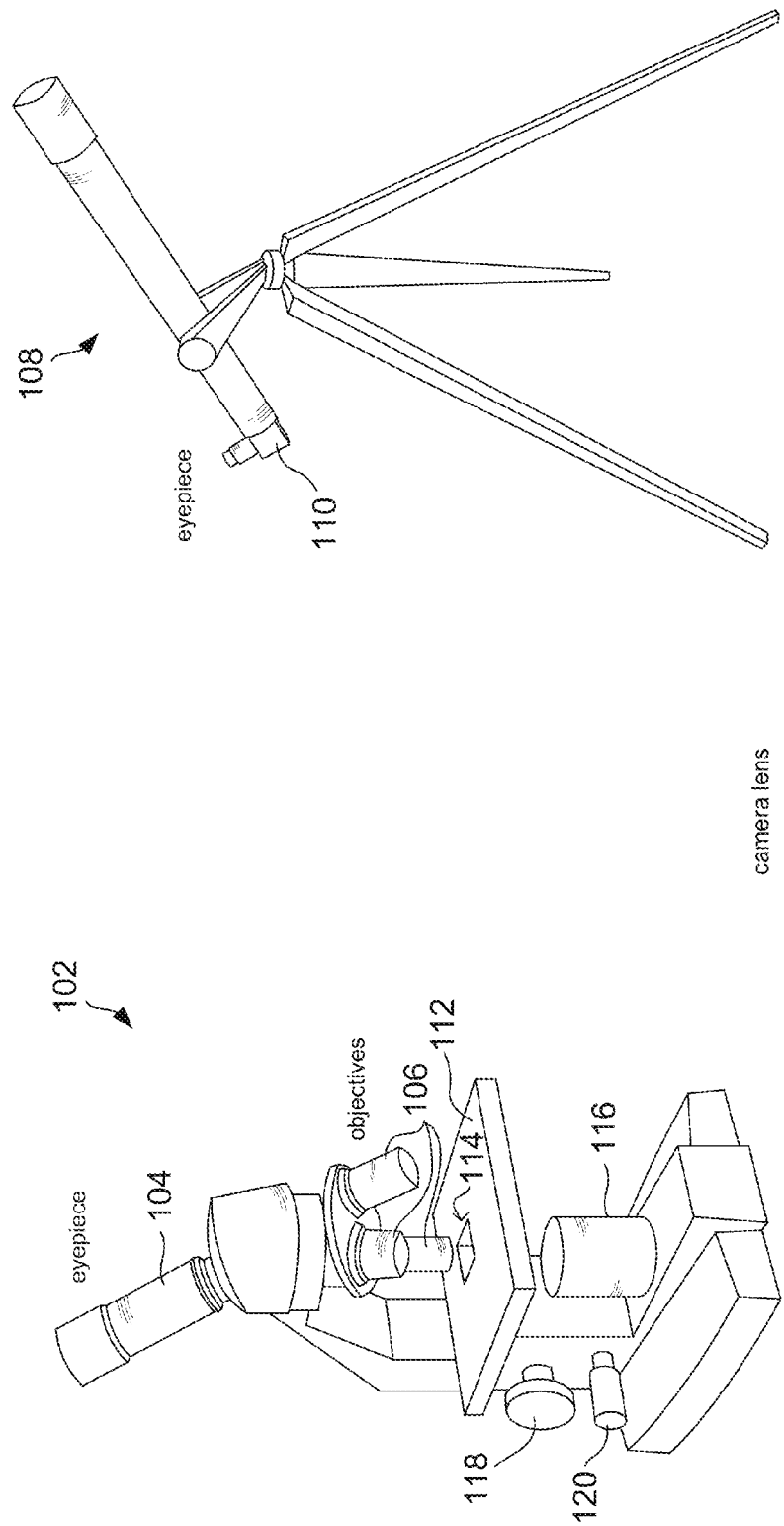
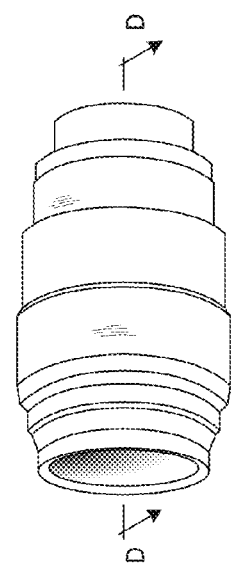

OPTICAL DEVICES BASED ON NON-PERIODIC SUB-WAVELENGTH GRATINGS

RELATED APPLICATIONS

This application is a continuation of U.S. patent application Ser. No. 13/259,886, filed 23 Sep. 2011, which is a U.S. National Stage under 35 USC 371 patent application, claiming priority to Serial No. PCT/US2010/022647, filed on 29 Jan. 2010, the entirety of both of which is incorporated herein by reference.

TECHNICAL FIELD

Embodiments of the present invention relate to sub-wavelength gratings and compound lens.

BACKGROUND

Optical systems such as monoculars, binoculars, telescopes, microscopes, cameras and projectors are composed of various arrangements of converging and diverging lenses. For example, typical optical systems employ compound lenses which are a one-dimensional array of simple convex or concave lenses with a common optical axis. Some of these optical systems produce a virtual image when viewed by the human eye, while others produce a real image that can be captured on photographic film or an optical sensor, or can be viewed on a screen.

However, conventional lenses typically do not form perfect images. In particular, there is nearly always at least some degree of image distortion or aberration introduced by even carefully manufactured lenses. Aberrations can be reduced by meticulously positioning, shaping, and polishing the lenses of an optical system, but this in turn increases the cost of manufacturing the optical system. Designers and manufacturers of optical systems also attempt to compensate for distortions and aberrations by fabricating compound lenses composed of simple lenses configured with complementary distortions or aberrations. However, this method of manufacturing optical systems can also be costly and time consuming.

Designers and manufacturers of optical systems continue to seek enhancements in lens design and lens manufacturing techniques.

BRIEF DESCRIPTION OF THE DRAWINGS

FIGS. 1A-1C show examples of optical imaging systems that each include at least one optical device configured in accordance with one or more embodiments of the present invention.

DETAILED DESCRIPTION

Figure 2A:
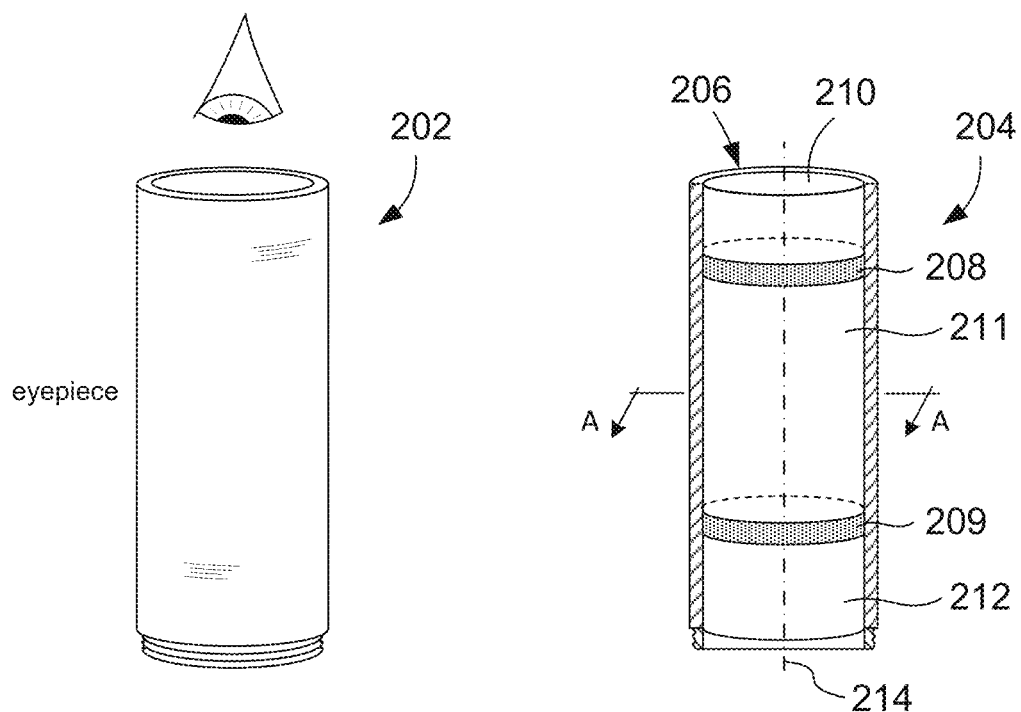
FIG. 2A shows an isometric view of an example eyepiece and cut-away of the eyepiece revealing an optical device configured in accordance with one or more embodiments of the present invention.

Various embodiments of the present invention are directed to optical devices comprising planar lenses, each of which includes a non-periodic, sub-wavelength grating. The optical devices can be incorporated as optical components in various optical imaging systems. FIGS. 1A-1C show examples of three optical imaging systems that each include at least one optical device configured in accordance with one or more embodiments of the present invention. In the example of FIG. 1A, a microscope 102 includes an eyepiece, or ocular, 104 and three objectives 106, and, in the example of FIG. 1B, a telescope 108 includes an eyepiece 110. In FIG. 1A, the objectives 106 are located closest to objects placed on the stage 112 and are illuminated through an opening 114 in the stage 112 by a light source 116. The objectives 106 can be operated to form real, inverted, magnified images of objects placed on the stage by adjusting coarse 118 and fine 120 adjustment knobs that raise and lower the stage 112. The eyepieces 104 and 106 are magnifiers that are used to view an intermediate image of an object as formed by preceding optical systems, such as the image formed by one of the objectives 106 or the image formed by internal mirrors of the telescope 108. The eyepieces 104 and 110 and objectives 106 can each be configured with an optical device of the present invention as described below. Optical imaging systems also include camera lenses, such as example camera lens shown in FIG. 1C. Various lens elements of a camera lens can be implemented with optical devices of the present invention. Optical devices can also be implemented in other kinds of optical image systems not shown and are not limited to the optical imaging system shown in FIGS. 1A-1C. For example, optical devices can be implemented in monoculars, binoculars, and projectors.

Optical Devices

The optical devices described herein are provided to present just a few examples of a large number of possible arrangements and combinations of planar lenses that can be used to form various optical devices. Optical devices of the present invention can be configured with any number, spacing, and arrangement of planar lenses to produce a wide variety of optical effects in addition to providing a desired level of magnification of an object. For example, the planar lenses of an optical device can be configured to transmit and refract only light with a particular polarization described in greater detail below. In certain embodiments, each planar lens of an optical device can be configured to operate as a simple lens and can be combined with other planar lenses to correct for various types of aberrations. Examples of simple lens include, but are not limited to, biconvex, planoconvex, biconcave, planoconcave, positive meniscus, and negative meniscus lenses. In other embodiments, a planar lens of an optical device can be configured to operate in the same manner as complimentary adjacent simple lenses.

FIG. 2A shows an isometric view of an example eyepiece 202 and a cut-away 204 of the eyepiece 202 that reveals an optical device 206 configured in accordance with one or more embodiments of the present invention. As shown in the example of FIG. 2A, the optical device 206 includes two planar lenses 208 and 209 and three low refractive index dielectric layers 210-212. The planar lens 208-209 and dielectric layers 210-212 are disposed adjacent to one another to form a single solid-state structure. FIG. 2A also includes an optical axis 214 for the eyepiece 202. The lenses 208 and 209 are approximately parallel and disposed substantially orthogonal to, and are configured with, the same optical axis 214.

Figure 2B:
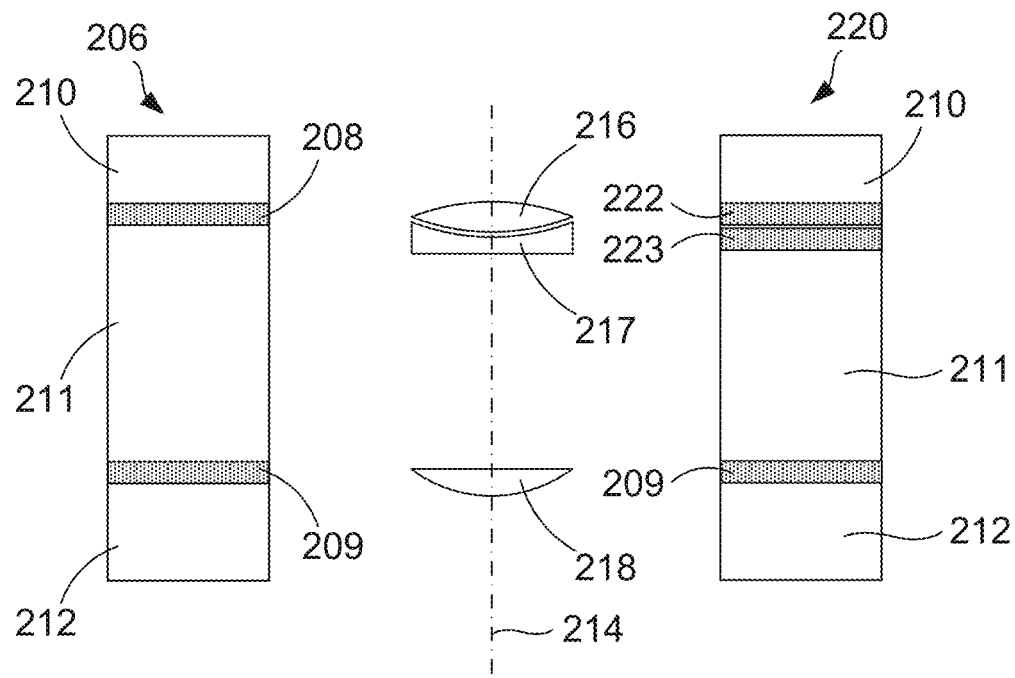
FIG. 2B shows a cross-sectional view of the optical device along a line A-A shown in FIG. 2A in accordance with one or more embodiments of the present invention.

FIG. 2B shows a cross-sectional view of the optical device 206 along a line A-A, shown in FIG. 2A, in accordance with one or more embodiments of the present invention. The planar lenses 208 and 209 are configured, as described below, to transmit and refract light propagating parallel to the optical axis 214. In other words, the planar lenses 208 and 209 are configured to operate as converging or diverging lenses for light transmitted along the optical axis 214. FIG. 2B, and subsequent Figures, include simples lenses that represent the optical properties associated with each of the planar lenses of an optical device. For example, planar lens 208 can be configured to operate as a combination a biconvex lens 216 and an adjacent planoconcave lens 217, and planar lens 209 can be configured to operate as a planoconvex lens 218. FIG. 2B includes a cross-sectional view of a second optical device 220 configured to transmit and refract light in a manner similar to the optical device 206. In the optical device 220, the planar lens 222 is configured to operate as the biconvex lens 216 and an adjacent planar lens 224 is configured to operate as the planoconcave lens 217. In other words, the combination of adjacent planar lenses 222 and 223 are configured to correct for aberrations.

Figure 3:
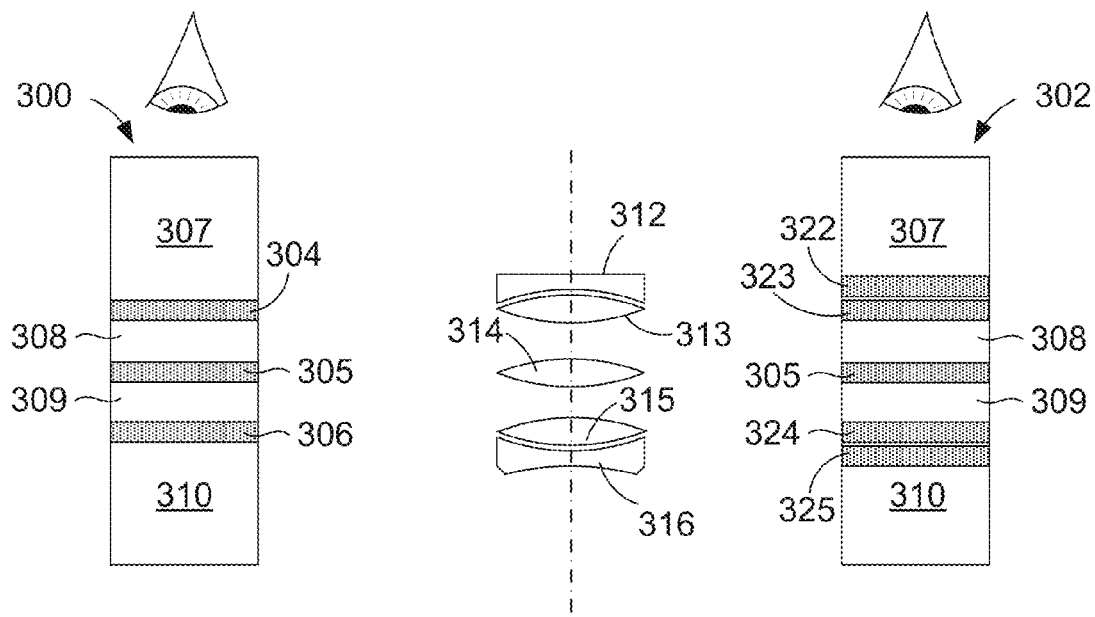
FIG. 3 shows cross-sectional views of two optical devices configured in accordance with one or more embodiments of the present invention.

FIG. 3 shows cross-sectional views of two optical devices 300 and 302 that can be incorporated in a second example of an eyepiece in accordance with one or more embodiments of the present invention. Optical device 300 includes three approximately parallel planar lenses 304-306 and four low refractive index dielectric layers 307-310. Planar lens 304 is configured to operate as combined planoconcave lens 312 and biconvex lens 313; planar lens 305 is configured to operate as biconvex lens 314; and planar lens 306 is configured to operate as combined biconvex lens 315 and biconcave lens 316. Optical device 302 is configured to transmit and refract light in a manner similar to the optical device 300, but with the planar lenses configured to operate as simple lenses that in combination correct for aberrations. In optical device 302, planar lenses 322-325 are configured to operate in the same manner as lenses 312, 313, 315, and 316, respectively.

Figure 4:
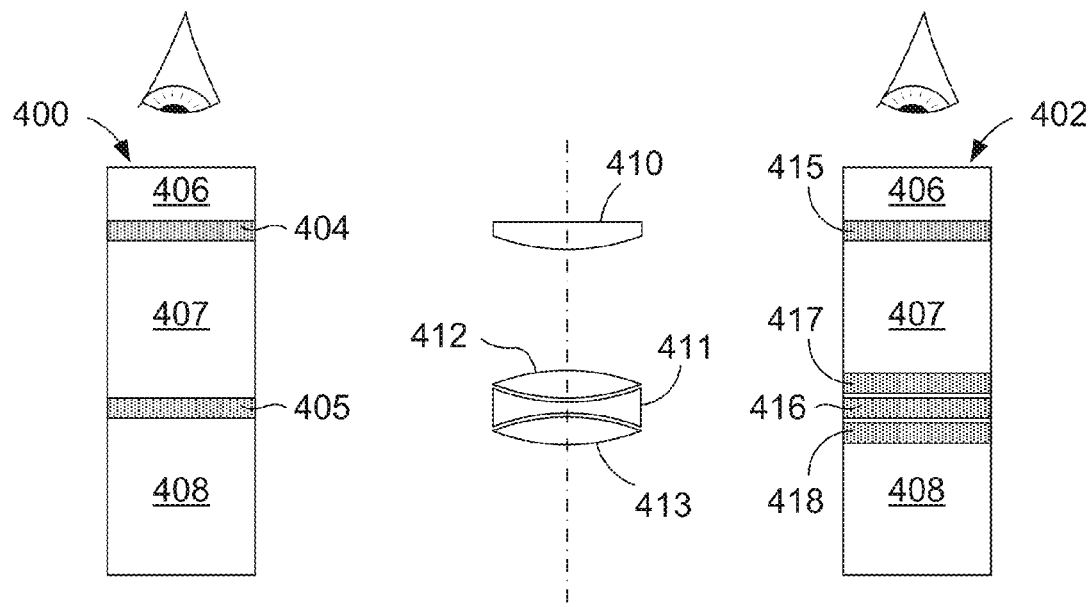
FIG. 4 shows cross-sectional views of two optical devices configured in accordance with one or more embodiments of the present invention.

FIG. 4 shows cross-sectional views of two optical devices 400 and 402 that can be incorporated in a third example of an eyepiece in accordance with one or more embodiments of the present invention. Optical device 400 includes two approximately parallel planar lenses 404 and 405 and three low refractive index dielectric layers 406-408. As shown in the example of FIG. 4, planar lens 404 is configured to operate as planoconvex lens 410; and planar lens 405 is configured to operate as biconcave lens 411 sandwiched between biconvex lenses 412 and 413. Optical device 402 is configured to transmit and refract light in a manner similar to the optical device 300. In optical device 402, planar lenses 416-418 are configured to operate in the same manner as simple lenses 411-413, respectively.

An eyepiece including either of optical devices 206 and 220 can be operated in substantially the same manner as a Kellner eyepiece, an eyepiece including either of optical devices 300 and 302 can be operated in substantially the same manner as an Erfle eyepiece, and an eyepiece including either of the optical devices 400 and 402 can be operated in substantially the same manner as an orthoscopic eyepiece. However, optical device embodiments of the present invention are not limited to the arrangements of planar lenses and dielectric layers corresponding to known eyepieces. Optical devices of the present invention can be configured with any arrangement of converging and/or diverging planar lenses to magnify images produced by an optical system.

Figure 5A:
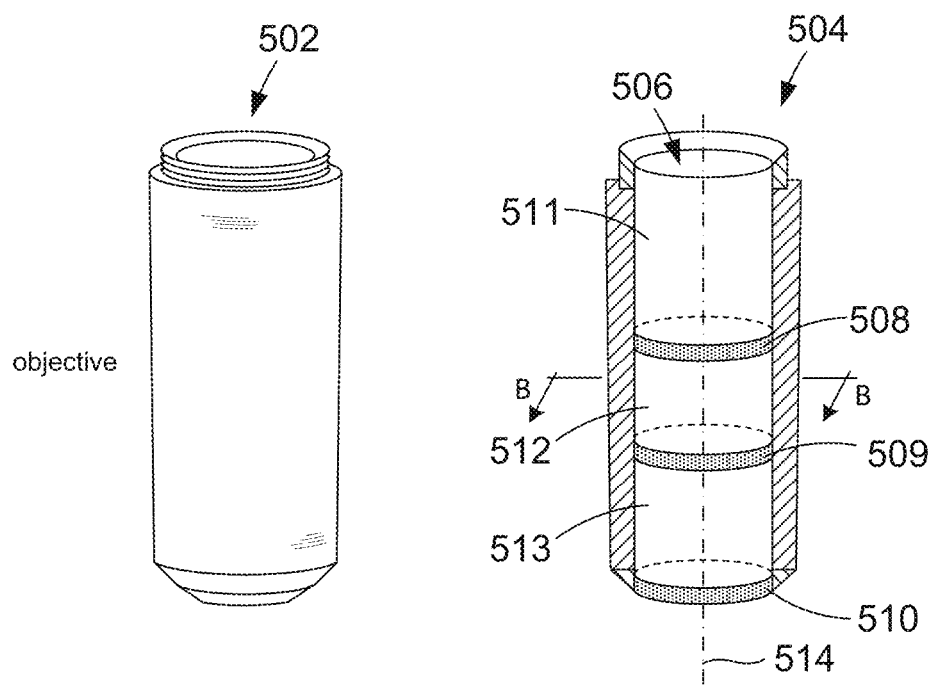
FIG. 5A shows an isometric view of an example microscope objective and cut-away of the objective revealing an optical device configured in accordance with one or more embodiments of the present invention.

Optical devices can also be configured to operate in microscope objectives. FIG. 5A shows an isometric view of an example microscope objective 502 and a cut-away 504 of the eyepiece 502 that reveals an optical device 506 configured in accordance with one or more embodiments of the present invention. As shown in the example of FIG. 5A, the optical device 506 includes three planar lenses 508-510 and three low refractive index dielectric layers 511-513. The planar lenses 508-510 and dielectric layers 511-513 form a single solid-state structure. The planar lenses 508-510 are approximately parallel and disposed substantially orthogonal to and are configured to share the same optical axis 514.

Figure 5B:
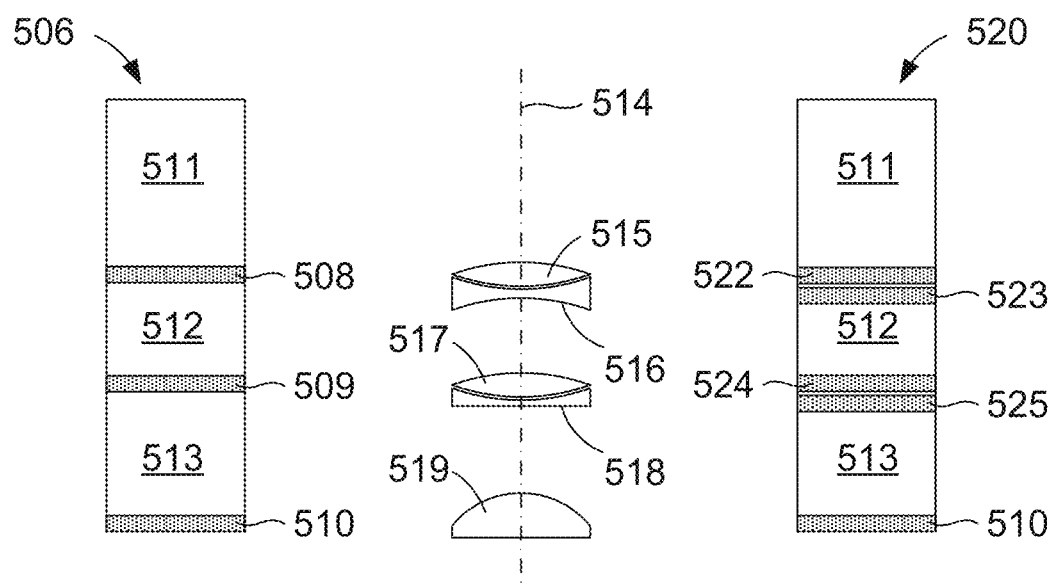
FIG. 5B shows a cross-sectional view of the optical device along a line B-B shown in FIG. 5A in accordance with one or more embodiments of the present invention.

FIG. 5B shows a cross-sectional view of the optical device 506 along a line B-B, shown in FIG. 5A, in accordance with one or more embodiments of the present invention. The planar lenses 508-510 are configured, as described below, to transmit and refract light propagating along the optical axis 514. For example, planar lens 508 can be configured to operate as a biconvex lens 515 combined with an adjacent biconvex lens 516; planar lens 509 can be configured to operate as a biconvex lens 517 combined with an adjacent planoconvex lens 518; and planar lens 510 can be configured to operate as planoconvex lens 519. FIG. 5B also includes a cross-sectional view of a second optical device 520 configured to transmit and refract light in a manner similar to the optical device 506. The optical device 520 includes the planar lenses 522-525 configured to operate in the same manner as simple lenses 514-518, respectively, to correct for aberrations.

Figure 6:
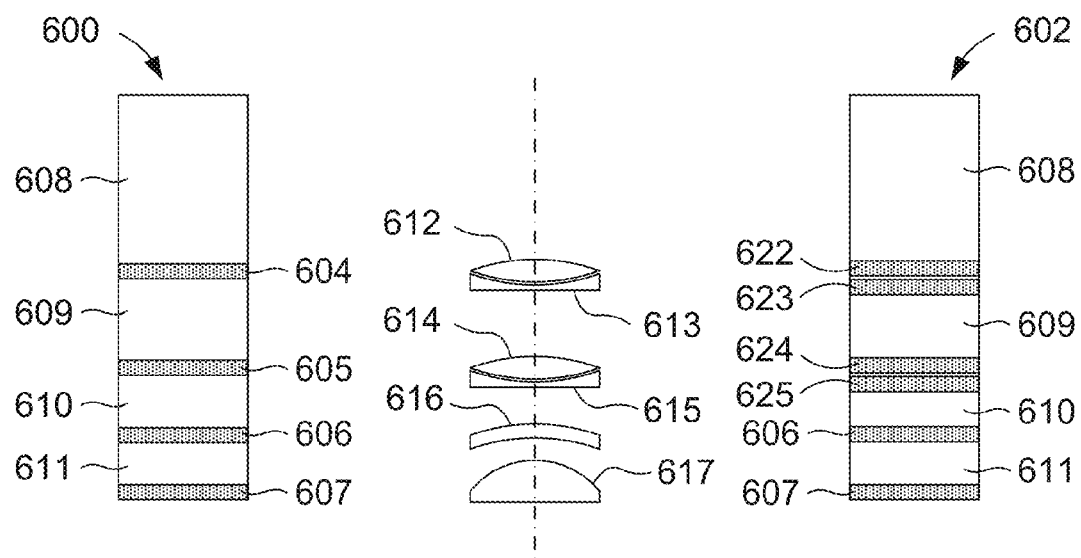
FIG. 6 shows cross-sectional views of two optical devices configured in accordance with one or more embodiments of the present invention.

FIG. 6 shows cross-sectional views of two optical devices 600 and 602 that can be incorporated in a second example of a microscope objective in accordance with one or more embodiments of the present invention. Optical device 600 includes four approximately parallel planar lenses 604-607 and four low refractive index dielectric layers 608-611. Planar lens 604 is configured to operate as a biconvex lens 612 combined with a planoconvex lens 613; planar lens 605 is configured to operate as a biconvex lens 614 combined with a planoconvex lens 615; planar lens 606 is configured to operate as a meniscus lens 616; and planar lens 607 is configured to operate as planoconvex lens 617. Optical device 602 is configured to transmit and refract light in a manner similar to the optical device 300. In optical device 302, planar lenses 622-625 are configured to operate in the same manner as simple lenses 612-615, respectively, to correct for aberrations.

The optical devices described above with reference to FIGS. 5 and 6 are merely provided as examples of the possible arrangements of converging and diverging planar lenses and dielectric layers that can be used to create objectives. Optical devices of the present invention can include any number, spacing, and arrangement of converging and diverging planar lenses to produce objectives with a wide variety of optical properties such as providing a desired level of magnification and polarization of the light transmitted through the optical device.

Figure 7:
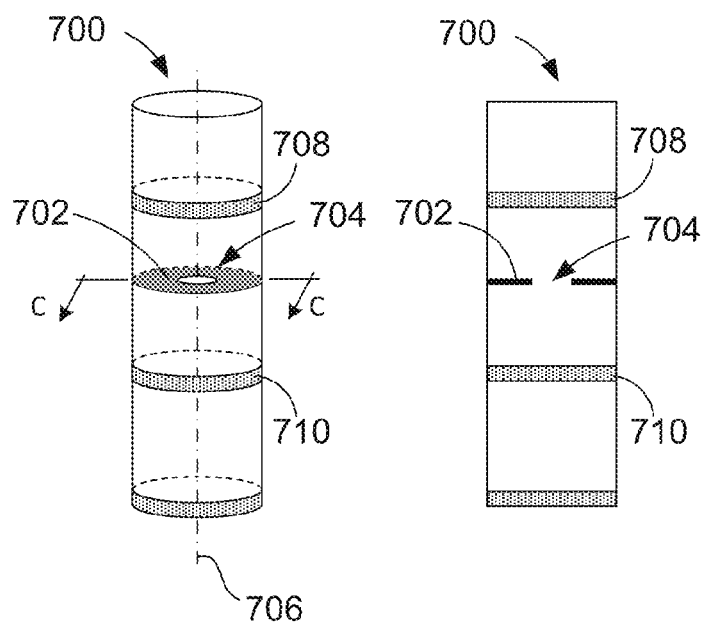
FIG. 7 shows an isometric view and a cross-sectional view of an example optical device configured in accordance with one or more embodiments of the present invention.

Optical devices can also be configured to include one or more aperture layers. FIG. 7 shows an isometric view and a cross-sectional view along a line C-C of an example optical device 700 including an aperture layer 702 configured in accordance with embodiments of the present invention. As shown in the example of FIG. 7, the aperture layer 702 includes an aperture or opening 704. The opening 704 is positioned in the aperture layer 702 so that the optical axis 706 of the optical device 700 passes through the opening 704. The opening 704 is dimensioned to collimate the light transmitted between planar lenses 708 and 710.

Figure 8A:
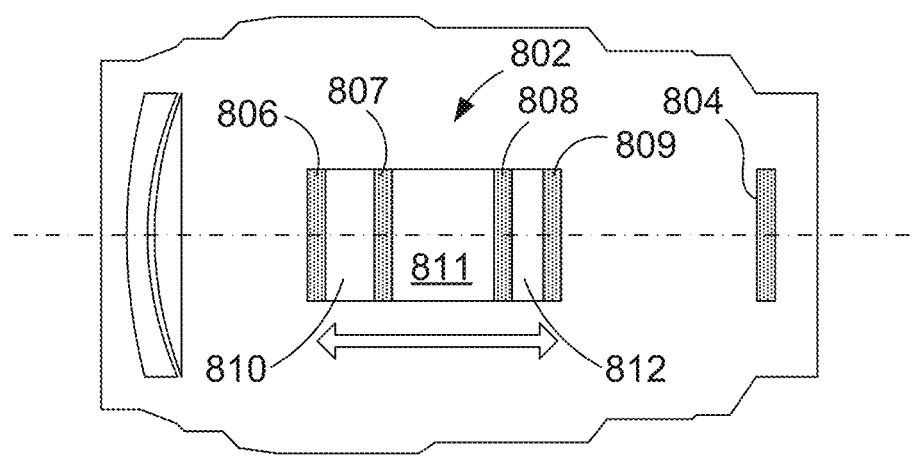
FIGS. 8A-8C show a cross-sectional views of optical devices of a camera lens configured in accordance with one or more embodiments of the present invention.
Figure 8B:
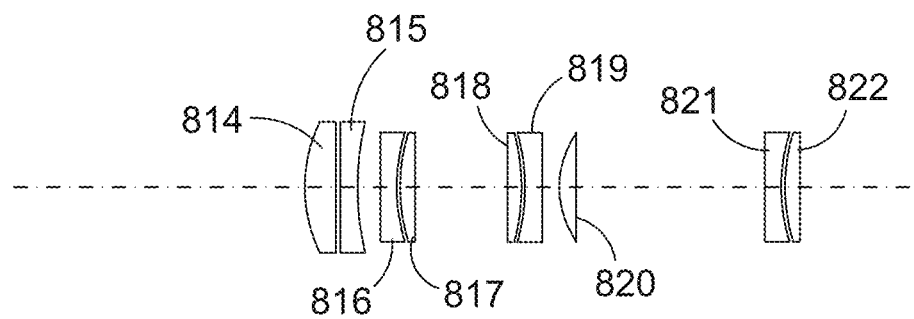
Figure 8C:
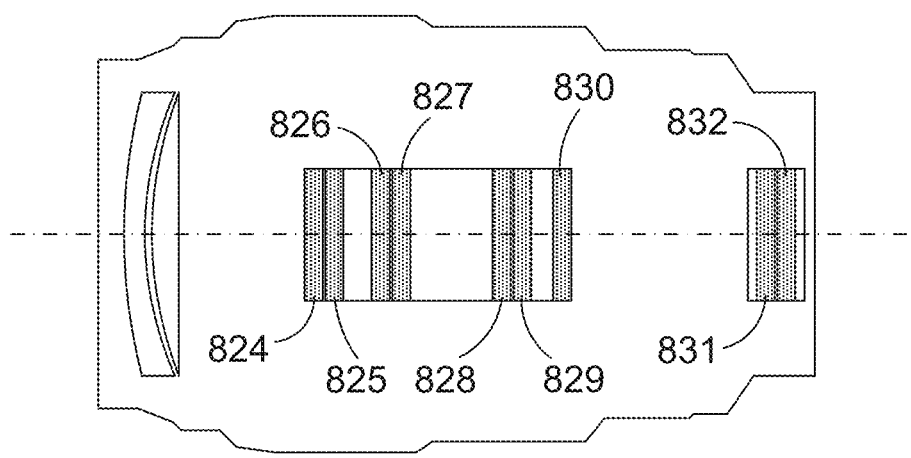

One or more optical devices can also be configured to operate in camera lenses. FIG. 8A shows a cross-sectional view of the camera lens shown in FIG. 1C, along a line D-D, configured in accordance with one or more embodiments of the present invention. The camera lens includes two optical devices 802 and 804. As shown in the example of FIG. 8A, the optical device 802 includes four planar lenses 806-809 and three low refractive index dielectric layers 810-812. The planar lenses 806-809 and dielectric layers 810-812 form a single solid-state structure as described above. FIG. 8B shows simple lenses representing the optical properties of the planar lenses 806-809. For example, planar lens 806 is configured to operate as a combination of a planoconvex lens 814 and planoconcave lens 815; planar lens 807 is configured to operate as a combination of a planoconcave lens 816 and planoconvex lens 817; planar lens 808 is configured to operate as a combination of a planoconvex lens 818 and planoconcave lens 819; planar lens 820 is configured to operate as planoconvex lens 820; and planar lens 804 is configured to operate as a combination of a planoconcave lens 816 and planoconvex lens 817. In other embodiments, the planar lenses can be configured to operate as simple lenses to correct for aberrations. For example, as shown in the example of FIG. 8C, planar lenses 824-832 can be configured to operate in the same manner as the simple lenses 814-822 shown in FIG. 8B, respectively.

Figure 9A:
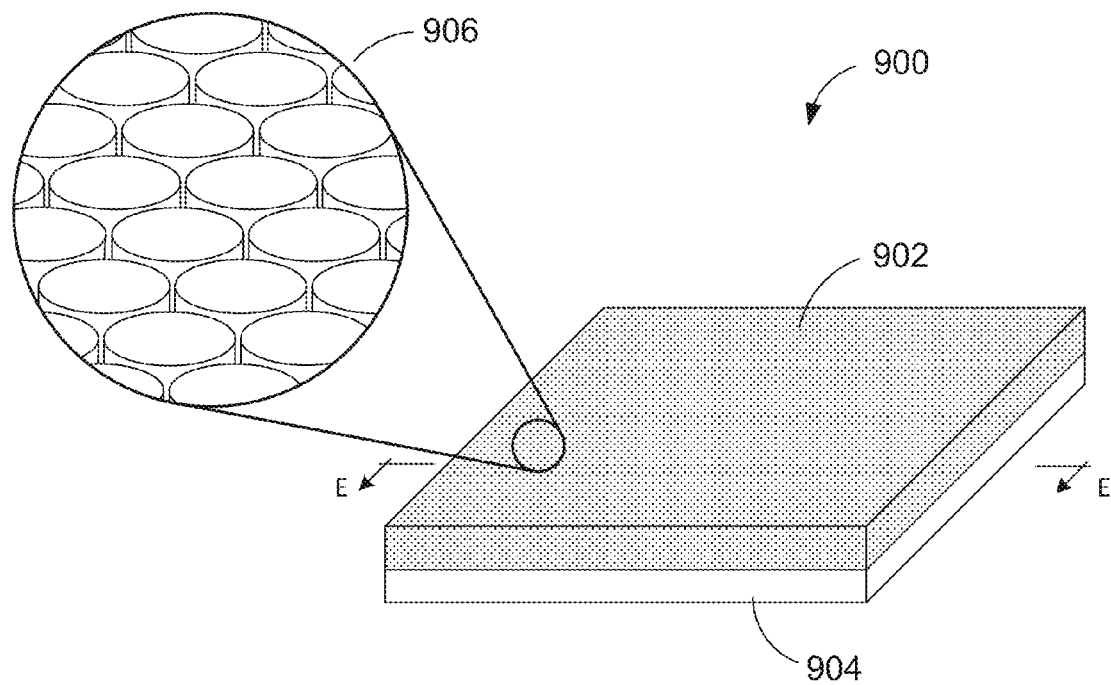
FIG. 9A shows an isometric view of a planar array of optical devices configured in accordance with one or more embodiments of the present invention.
Figure 9B:
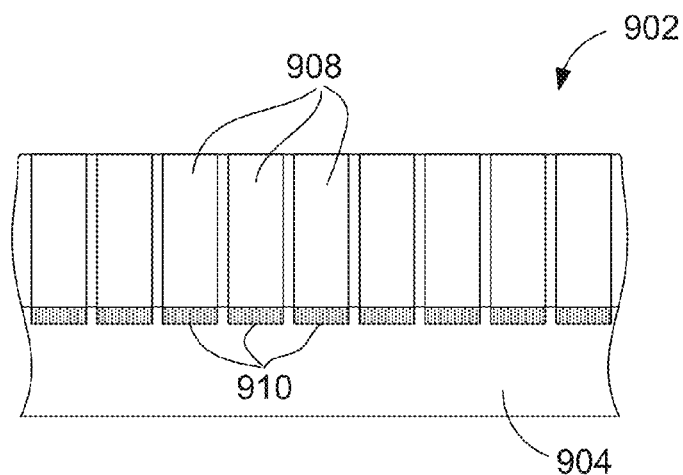
FIG. 9B shows a cross-sectional view of a portion of the optical devices located along a line E-E shown in FIG. 9A in accordance with one or more embodiments of the present invention.

Optical system of the present invention also includes lens arrays composed of optical devices. FIG. 9A shows an isometric view of a planar array of optical devices configured in accordance with one or more embodiments of the present invention. As shown in the example of FIG. 9A, lens array 900 includes an array of optical devices 902 disposed on a substrate 904. FIG. 9A includes an enlargement 906 of a portion of the array of optical devices 902. The substrate 904 can be configured to include an array of photosensors (not shown), where each optical devices is optically coupled to at least one photosensor of the photosensor array. FIG. 9B shows a cross-sectional view of a portion of the optical devices located along a line E-E, shown in FIG. 9A, in accordance with one or more embodiments of the present invention. As shown in the example of FIG. 9B, each optical device 908 is optically coupled to a photosensor 910 embedded within the substrate 904. Each optical device 908 can be configured with converging and/or diverging planar lenses as described above to direct incident light to a corresponding photosensor.

Figure 10A:
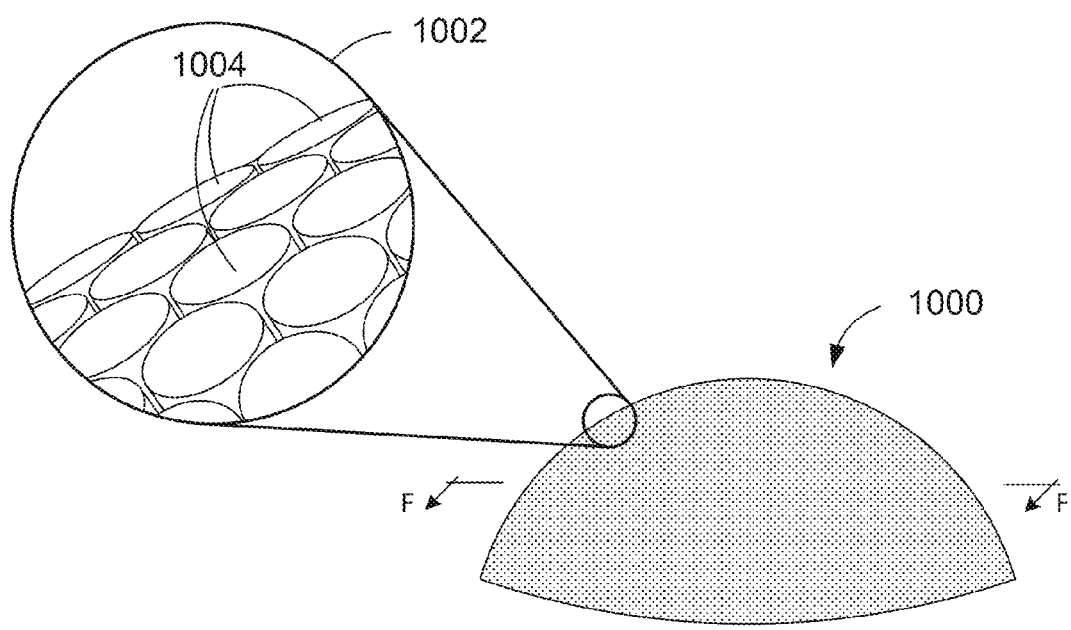
FIG. 10A shows an isometric view of a hemispherical array of optical devices configured in accordance with one or more embodiments of the present invention.
Figure 10B:
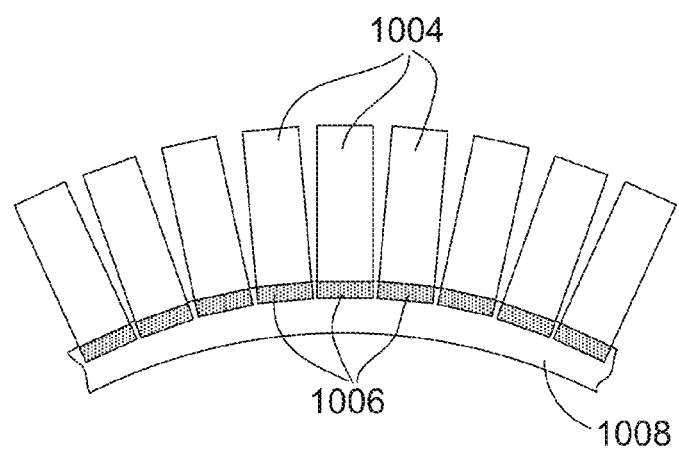
FIG. 10B shows a cross-sectional view of a portion of the optical devices located along a line F-F shown in FIG. 10A in accordance with one or more embodiments of the present invention.

In other embodiments, rather than arraying the optical devices on a flat substrate, as described above, the substrate can be hemispherical or spherical-shaped so that the array of optical devices can be operated like a compound eye. FIG. 10 shows an isometric view of a hemispherical array of optical devices 1000 configured in accordance with one or more embodiments of the present invention. FIG. 10A includes an enlargement 1002 of a portion of the array of optical devices 1000. Each optical device 1004 can be optically coupled to a photosensor embedded within the hemispherical-shaped substrate. FIG. 10B shows a cross-sectional view of a portion of the optical devices located along a line F-F, shown in FIG. 10A, in accordance with one or more embodiments of the present invention. As shown in the example of FIG. 10B, each optical device 1004 is optically coupled to a photosensor 1006 embedded within a hemispherical-shaped substrate 1008. Each optical device 1004 can be configured with converging and/or diverging planar lenses as described above to direct incident light to a corresponding photosensor. The hemispherical shape of the optical device array 1000 enables detection of incident light from different directions.

Planar Lenses

Figure 11:
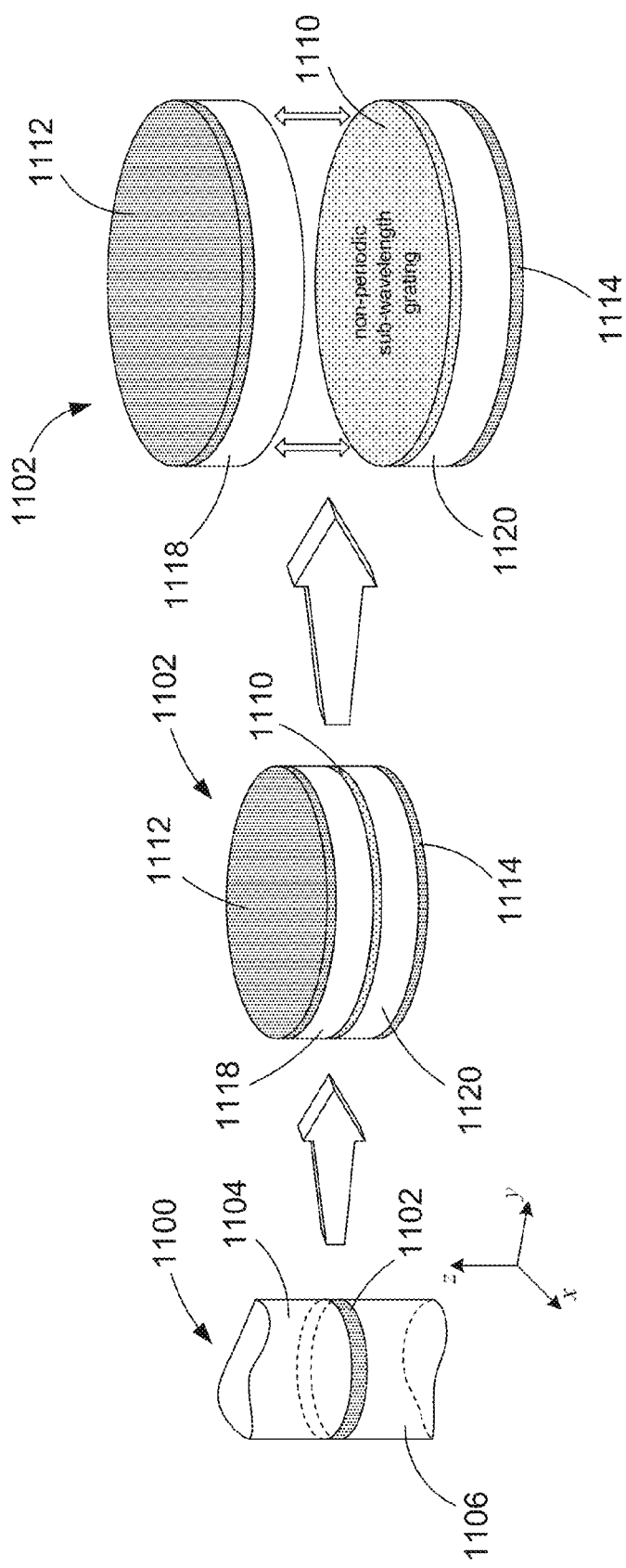
FIG. 11 shows a portion of an optical device and a planar lens configured in accordance with one or more embodiments of the present invention.

FIG. 11 shows a portion 1100 of an optical device and a planar lens configured in accordance with one or more embodiments of the present invention. The portion 1100 includes a planar lens 1102 disposed between portions of two dielectric layers 1104 and 1106. FIG. 11 shows an enlargement of the planar lens 1102 revealing the layered structure of the planar lens 1102. The planar lens 1102 includes an approximately planar sub-wavelength grating ("SWG") layer 1110 disposed between two approximately parallel and planar reflective layers 1112 and 1114. FIG. 11 also shows an exploded isometric view with the layer 1118 separated from the SWG layer 1110. The SWG layer 1110 includes a non-periodic SWG ("NP-SWG") pattern, described in greater detail below. Spacer layer 1118 separates the SWG layer 1110 from the reflective layer 1112, and spacer layer 1120 separates the SWG layer 1110 from the reflective layer 1114. The SWG layer 1110 and the reflective layer 1112 are separated by the lower refractive index spacer layer 118 to form a first resonant cavity, and the SWG layer 1110 and the reflective layer 1114 are also separated by the spacer layer 1120 to form a second resonant cavity, for appropriate modes of incident electromagnetic radiation. In other words, the SWG layer 1110 separates the first and second optical cavities.

The SWG layer 1110 can be composed of any suitable semiconductor material, such as silicon ("Si"), gallium arsenide ("GaAs"), or indium phosphide ("InP"). The SWG layer 1110 can also be composed of a dielectric material, such as silicon carbide ("SiC"). The dielectric layers 1104 and 1106 can be composed of a dielectric material, such as $Al_2O_3$, or $SiO_2$, or a suitable polymer having a low refractive index. The reflective layers 1112 and 1114 can be composed of a dielectric material; a semiconductor; or a metal, such as gold ("Au") or silver ("Ag"). The spacer layers 1118 and 1120 can be composed of a suitable polymer or another dielectric material, the polymer and the dielectric material having a lower refractive index than the layers 1110, 1112, and 1114.

Figure 12:
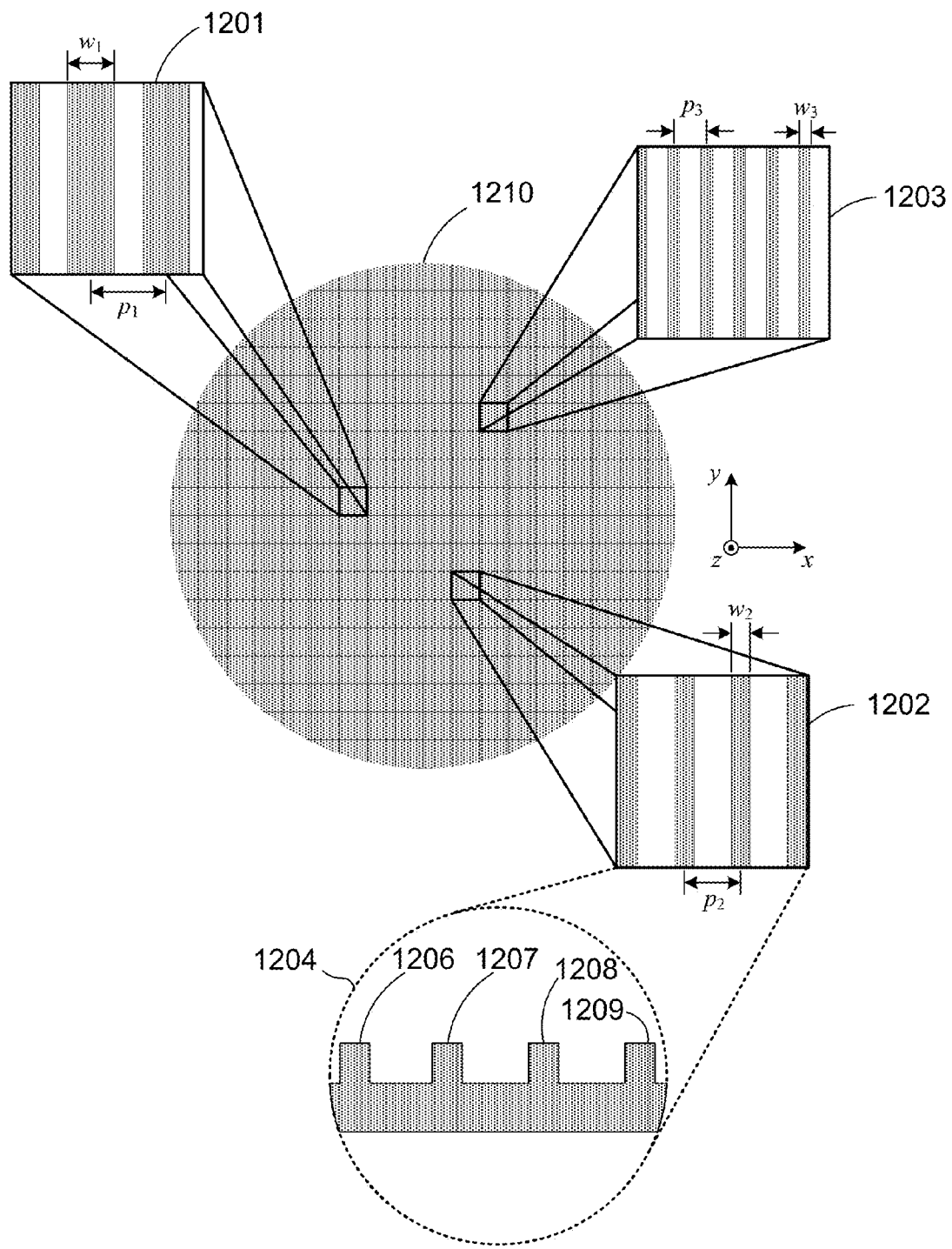
FIG. 12 shows a top plan view of a non-periodic, sub-wavelength grating layer of a planar lens configured in accordance with one or more embodiments of the present invention.

FIG. 12 shows a top plane view of the SWG layer 1110 configured with a one-dimensional grating pattern in accordance with one or more embodiments of the present invention. The one-dimensional grating pattern is composed of a number of one-dimensional grating sub-patterns. In the example of FIG. 12, three exemplary grating sub-patterns 1201-1203 are enlarged. Each grating sub-pattern comprises a number of regularly spaced wire-like portions of the SWG layer 1110 material called "lines." The lines extend in the y-direction and are periodically spaced in the x-direction. FIG. 12 also includes an enlarged end-on view 1204 of the grating sub-pattern 1202. In end-on view 1204, the SWG layer 1110 can be a single layer with lines, such as lines 1206-1209, separated by grooves formed in the layer.

As shown in the example of FIG. 12, each sub-pattern is characterized by a particular periodic spacing of the lines and by the line width in the x-direction. For example, the sub-pattern 1201 comprises lines of width $w_1$ periodically spaced with a period $p_1$, the sub-pattern 1202 comprises lines with width $w_2$ periodically spaced with a period $p_2$, and the sub-pattern 1203 comprises lines with width $w_3$ periodically spaced with a period $p_3$. The grating sub-patterns 1201-1203 form sub-wavelength gratings that preferentially reflect incident light polarized in one direction, e.g. light polarized in the x direction, provided the periods $p_1$, $p_2$, and $p_3$ are smaller than the wavelength of the incident light. For example, the line widths can range from approximately 10 nm to approximately 300 nm and the periods can range from approximately 20 nm to approximately 1 μm depending on the wavelength of the light incident on the planar lens 1102. The light reflected from a sub-region acquires a phase φ determined by the line thickness t, and the duty cycle η defined by:

$$\eta = \frac{w}{p}$$

where w is the line width and p is the period of the lines associated with the region.

Each of the grating sub-patterns 1201-1203 also reflect incident light polarized in one direction differently due to the different duty cycles and periods associated with each of the sub-patterns. Note the SWG layer 1110 can be configured to reflect the x-polarized component or the y-polarized component of the incident light by adjusting the period, line width, and line thickness of the lines. For example, a particular period, line width and thickness may be suitable for reflecting the x-polarized component of light but may not be suitable for reflecting the y-polarized component; and a different period, line width, and line thickness may be suitable for reflecting the y-polarized component but may not be suitable for reflecting the x-polarized component.

A planar lens can be fabricated using deposition and lithographic techniques. A first reflective layer can be formed on dielectric layer using wafer bonding, chemical vapor deposition ("CVD"), or physical vapor deposition ("PVD"). A first spacer layer can then be deposited on the reflective layer using spin-on glass, CVD, or PVD. A SWG layer is deposited on the surface of the spacer layer using wafer bonding, CVD, or PVD. A NP-SWG can be formed in the SWG layer using reactive ion etching, focused ion beam milling, nanoimprint lithography, or any other suitable technique for forming a non-periodic, sub-wavelength grating pattern in the SWG layer. A second spacer layer can be deposited over the SWG layer using spin-on glass, CVD, or PVD followed by deposition of a second reflective layer using CVD or PVD.

Figure 13:
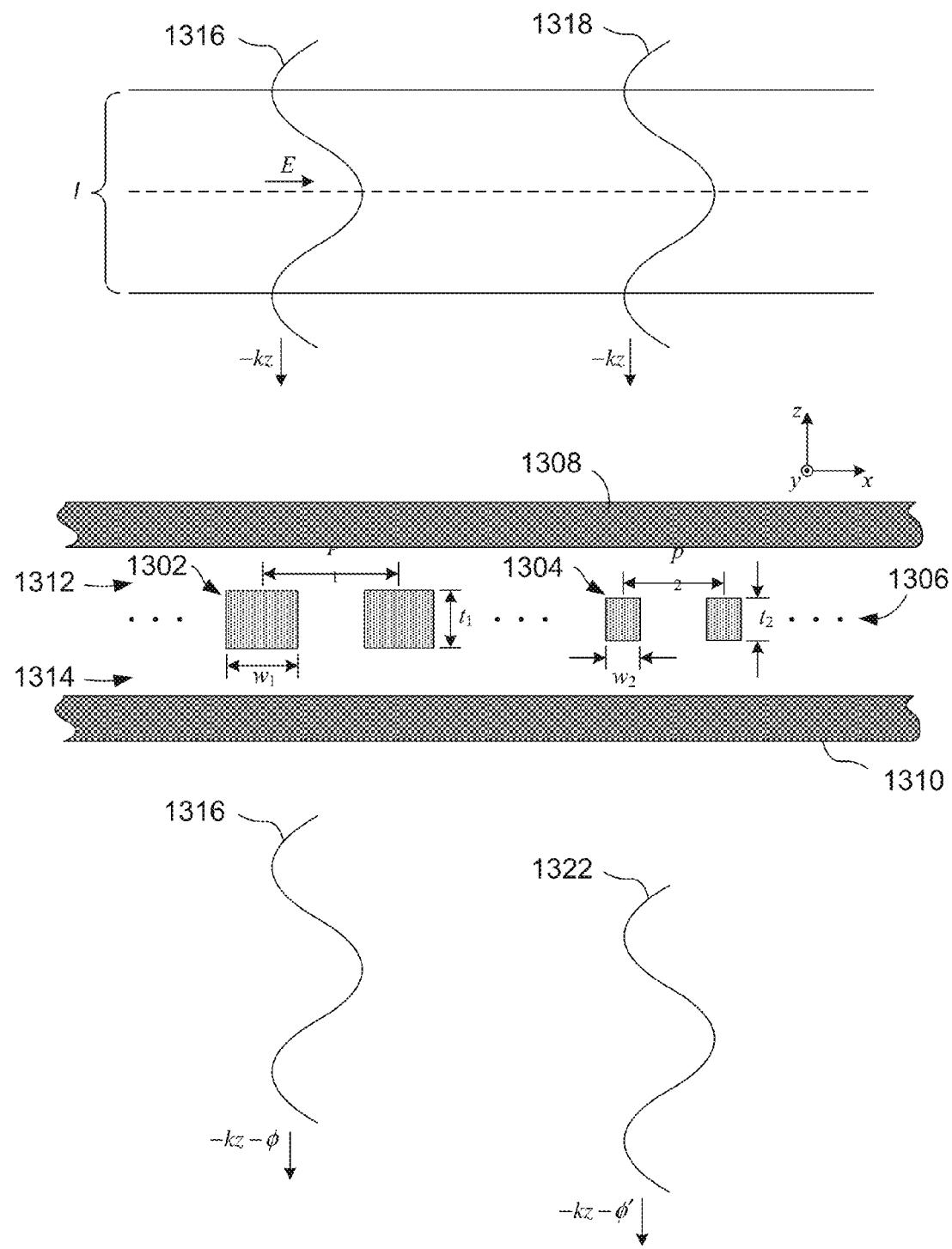
FIG. 13 shows a cross-sectional view of a planar lens operated in accordance with one or more embodiments of the present invention.

FIG. 13 shows a cross-sectional view of a planar lens revealing portions of two separate grating sub-patterns 1302 and 1304 of a SWG layer 1306 disposed between a first reflective layer 1308 and a second reflective layer 1310 in accordance with embodiments of the present invention. The sub-patterns 1302 and 1304 can be located in different regions of the SWG layer 1306. The thickness $t_1$ of the lines of sub-pattern 1302 are greater than the thickness $t_2$ of the lines of sub-pattern 1304, and the duty cycle $\eta_1$ associated with the lines in sub-pattern 1302 is greater than the duty cycle $\eta_2$ associated with the lines of sub-pattern 1304. Light polarized in the x-direction and incident on the planar lens becomes trapped and oscillates for a period of time within the resonant cavities 1312 and 1314. The light is ultimately transmitted through the layers 1306, 1308, and 1310, but with the portion of light transmitted through the sub-region 1302 acquiring a larger phase shift than the portion of light transmitted through the sub-region 1304. As shown in the example of FIG. 13, the incident waves 1316 and 1318 strike the planar lens with approximately the same phase, but the wave 1320 transmitted through the sub-pattern 1302 acquires a relatively larger phase shift φ than the phase shift φ' (i.e., φ>φ') acquired by the wave 1322 transmitted through the sub-pattern 1304.

Figure 14:
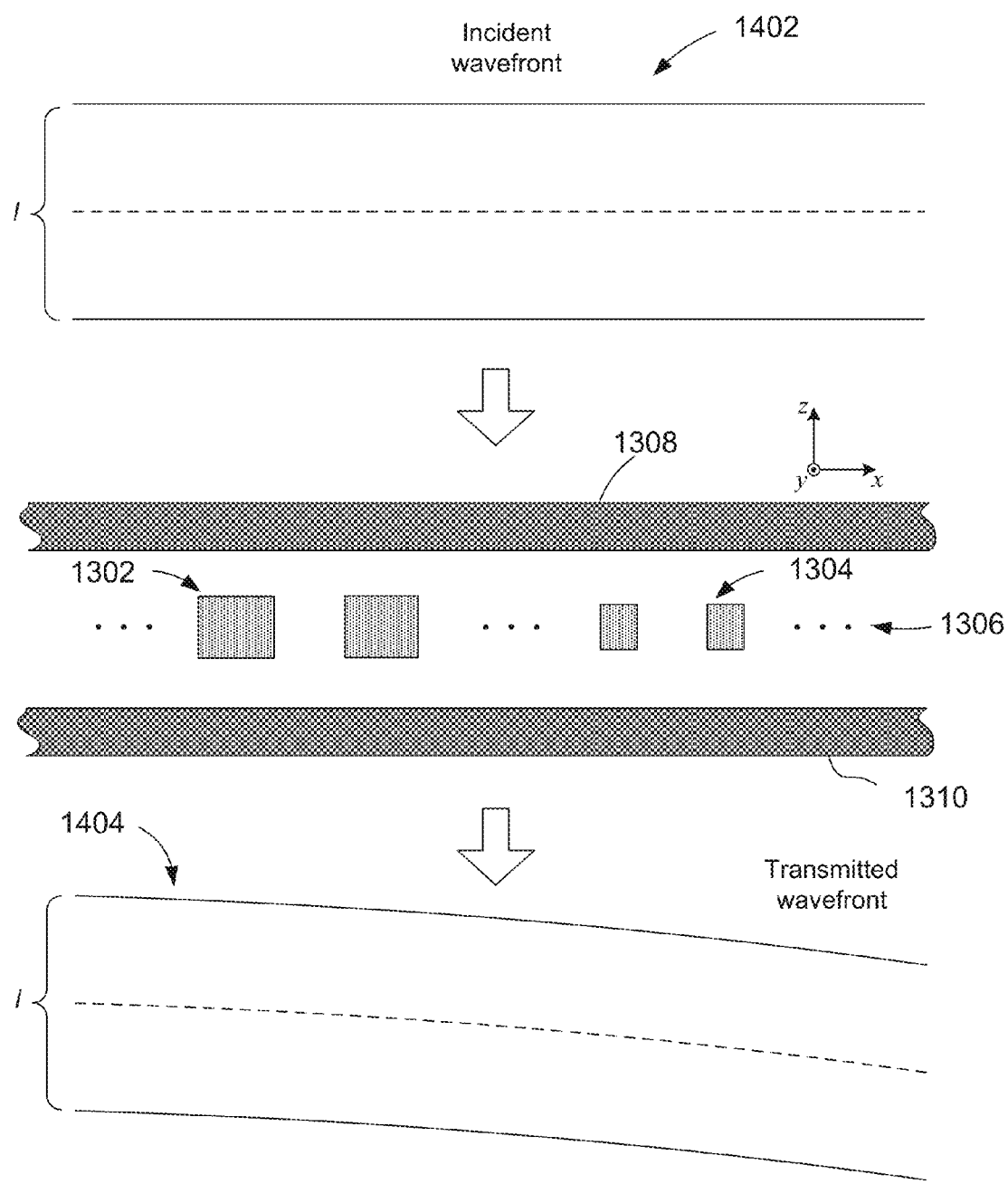
FIG. 14 shows a cross-sectional view of a planar lens operated in accordance with one or more embodiments of the present invention.

FIG. 14 shows a cross-sectional view of a planar lens revealing how a transmitted wavefront can be changed in accordance with one or more embodiments of the present invention. As shown in the example of FIG. 14, incident light with a substantially uniform wavefront 1402 strikes the planar lens producing transmitted light with a curved transmitted wavefront 1404. The transmitted wavefront 1404 results from portions of the incident wavefront 1402 interacting with the sub-region 1302 with a relatively larger duty cycle $\eta_1$ and thickness $t_1$ than portions of the same incident wavefront 1402 interacting with the sub-region 1304 with a relatively smaller duty cycle $\eta_2$ and thickness $t_2$. The shape of the transmitted wavefront 1404 is consistent with the larger phase acquired by light interacting with sub-region 1302 relative to the smaller phase shift acquired by light interacting with the sub-region 1304.

Planar lenses of the present invention can be configured to apply a particular phase change to transmitted light. In particular, the SWG layer 1110 can be configured with a one-dimensional grating pattern to apply a phase change to transmitted light polarized substantially perpendicular to the lines, as described above with reference to FIGS. 12-14.

Figure 15:
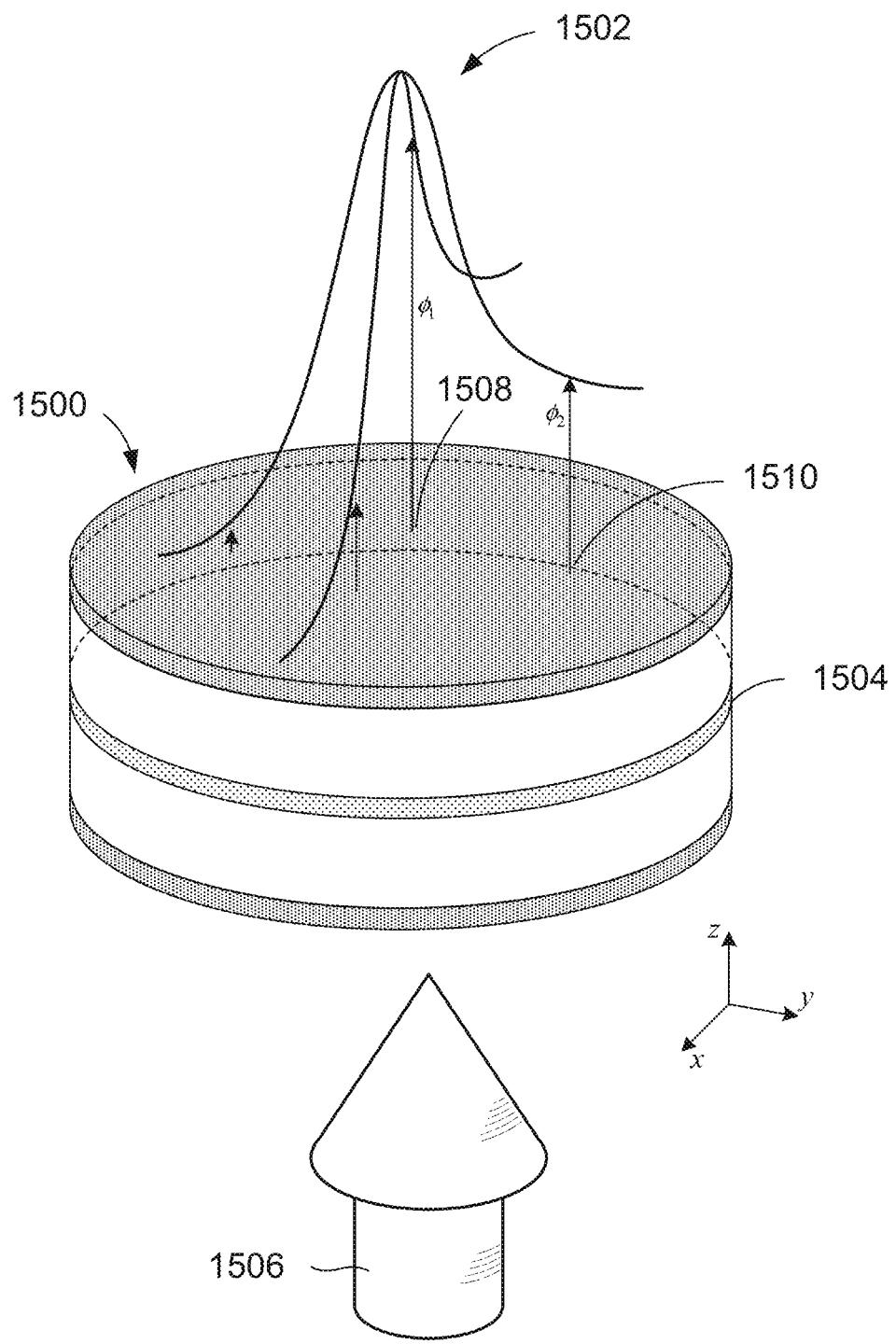
FIG. 15 shows an isometric view of an exemplary phase contour map produced by an example planar lens configured in accordance with one or more embodiments of the present invention.

FIG. 15 shows an isometric view of an exemplary phase change contour map 1502 produced by a particular grating pattern of a SWG layer 1504 of a planar lens 1500 in accordance with one or more embodiments of the present invention. The contour map 1502 represents an example of the magnitude of the phase change acquired by light 1506 transmitted through the planar lens 1500. In the example shown in FIG. 15, the grating pattern in the SWG layer 1504 produces a phase contour map 1502 with the smallest magnitude in the phase acquired by transmitted light occurring near the center of the planar lens 1500. The magnitude of the phase acquired by transmitted light decreases away from the center of the planar lens 1500. For example, light transmitted near the center 1508 of the planar lens 1500 acquires a phase of $\varphi_1$, and light transmitted through the region 1510 acquires a phase of $\varphi_2$. Because $\varphi_1$ is much larger than $\varphi_2$, the light transmitted through the center 1508 acquires a much larger phase than the light transmitted through the region 1510.

The phase change in turn shapes the wavefront of light transmitted through the planar lens. For example, as described above with reference to FIG. 13, lines having a relatively larger duty cycle produce a larger phase shift in transmitted light than lines having a relatively smaller duty cycle. As a result, a first portion of a wavefront transmitted through a region of a planar lens with sub-pattern lines having a first duty cycle lags behind a second portion of the same wavefront transmitted through a different portion of the planar lens with sub-pattern lines having a second relatively smaller duty cycle. Embodiments of the present invention include patterning the SWG layer to control the phase change and ultimately the shape of the transmitted wavefront so that the planar lens can be operated with particular optical properties.

Figures 16A, 16B:
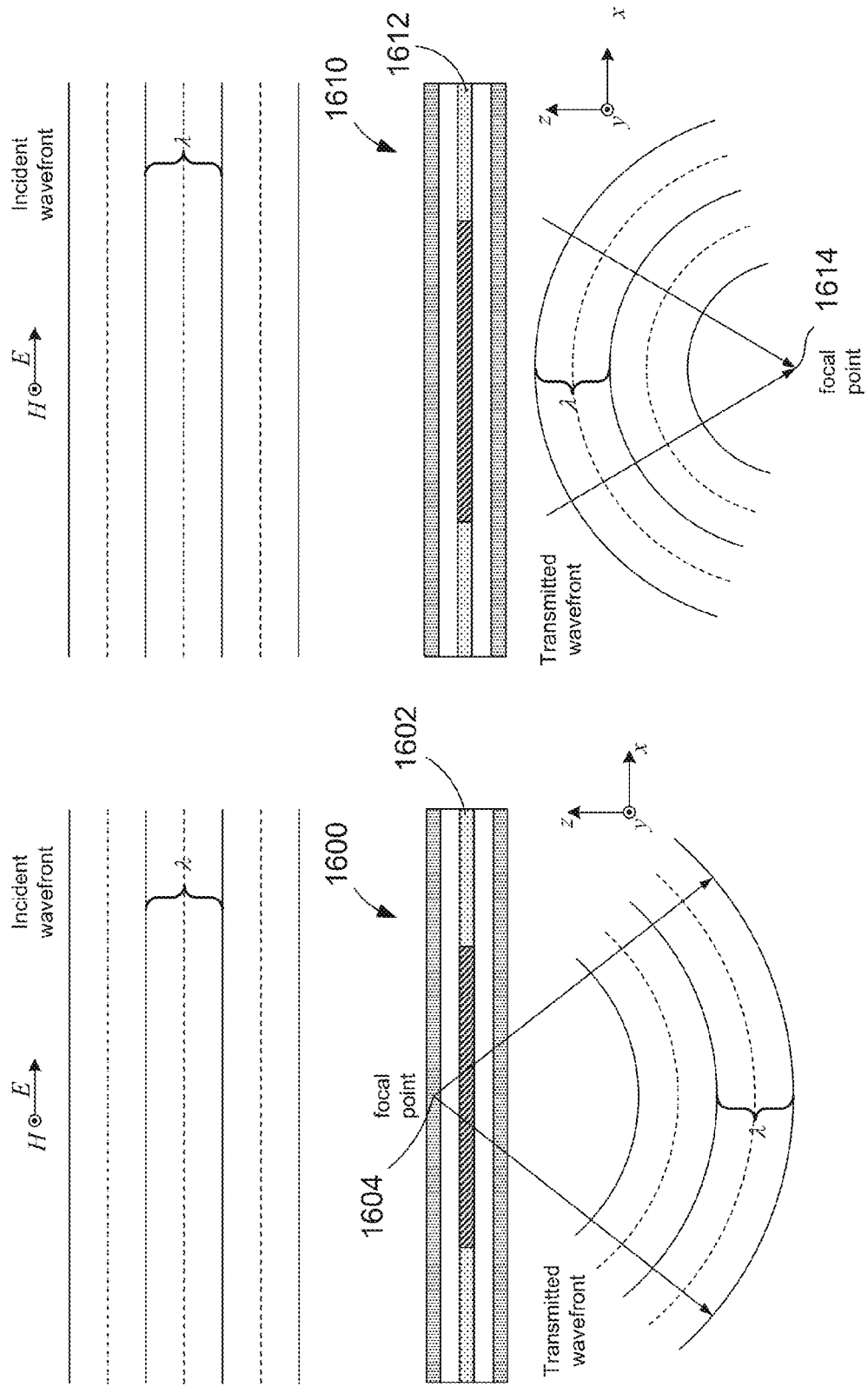
FIG. 16A shows a cross-sectional view of a planar lens configured to produce divergent light in accordance with one or more embodiments of the present invention.
FIG. 16B shows a cross-sectional view of a planar lens configured to focus light onto a focal point in accordance with one or more embodiments of the present invention.

FIG. 16A shows a cross-sectional view of a planar lens 1600 with a SWG layer 1602 configured to diverge light as if the light emanated from a focal point 1604 in accordance with one or more embodiments of the present invention. In the example of FIG. 16A, the SWG of the SWG layer 1602 is configured with a non-periodic grating pattern that causes incident light polarized in the x-direction to be transmitted with a wavefront corresponding to the transmitted light diverging from the focal point 1604. On the other hand, FIG. 16B shows a cross-sectional view of a planar lens 1610 with a SWG layer 1612 configured to focus light onto a focal point 1614 in accordance with one or more embodiments of the present invention. In the example of FIG. 16B, the SWG of the SWG layer 1612 is configured with a non-periodic grating pattern that causes incident light polarized in the x-direction to be transmitted with a wavefront corresponding to light directed to the focal point 1614.

Configuring Non-Periodic, Sub-wavelength Gratings

Figure 17:
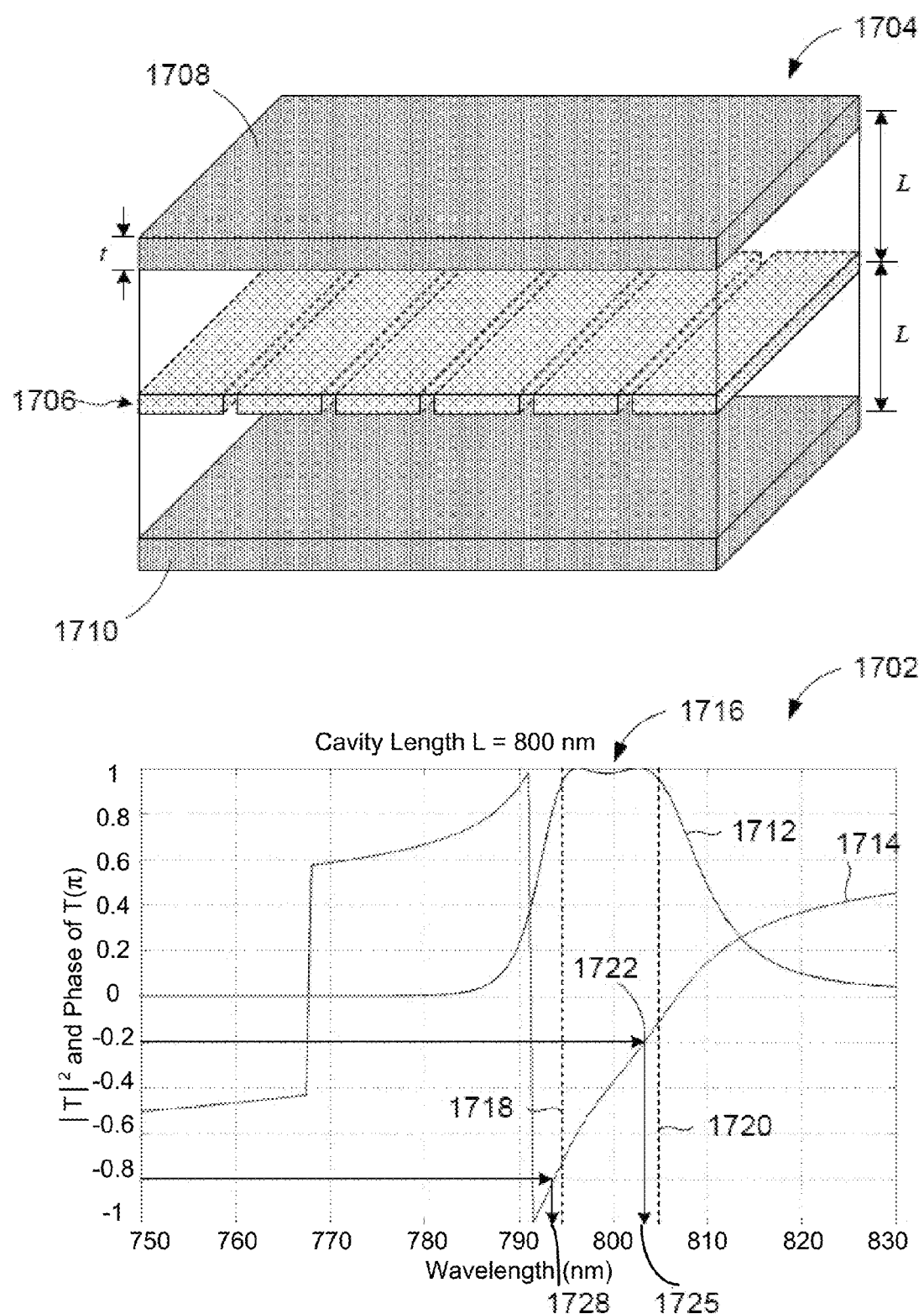
FIG. 17 shows a plot of transmittance and phase shift for an optical device over a range of wavelengths in accordance with one or more embodiments of the present invention.

A planar lens can be designed to introduce a desired phase front for transmitted light in a number of ways. A first method for configuring the SWG layer includes determining a transmission profile for a planar lens. The transmission coefficient for a planar lens is a complex valued function represented by:

$$T(\lambda) = \sqrt{T_P(\lambda)} e^{i\varphi(\lambda)}$$

where $T_P(\lambda)$ is the power transmittance of the planar lens, and $\varphi(\lambda)$ is the phase shift or change produced by the planar lens. FIG. 17 shows a plot 1702 of transmittance and phase shift simulation results over a range of incident light wavelengths for a planar lens 1704 including a SWG layer 1706 in accordance with embodiments of the present invention. For the planar lens 1704, the cavity length L is 800 nm and the thickness t of the reflective structures is 280 nm. The reflective structures 1708 and 1710 have a refractive index of 3.48, and the SWG layer 1706 has a refractive index of 3.2 and a one-dimensional grating pattern with a duty cycle of 0.45. The planar lens 1704 is operated at normal incidence with the electric field polarized substantially perpendicular to the lines comprising the SWG layer 1706. In plot 1702, curve 1712 corresponds to the transmittance $T(\lambda)$ and curve 1714 corresponds to the phase shift $\varphi(\lambda)$ produced by the planar lens 1704 for the incident light over the wavelength range of approximately 750 nm to approximately 830 nm. The transmittance and phase curves 1712 and 1714 represent expected operation of the planar lens 1704 and can be obtained using either the application "MIT Electromagnetic Equation Propagation" ("MEET") simulation package to model electromagnetic systems (ab-initio.mit.edu/meep/meep-1.1.1.tar.gz), or COMSOL Multiphysics® which is a finite element analysis and solver software package that can be used to simulate various physics and engineering applications (see, www.comsol.com). Curve 1712 reveals a broad spectral region of high transmittance 1716. However, curve 1714 reveals that the phase of the reflected light varies across the entire high-reflectivity spectral region between dashed-lines 1718 and 1720.

The plot 1702 can be used to uniformly adjust geometric parameters of the entire planar lens in order to produce a desired change in the transmitted wavefront. When the spatial dimensions of the entire planar lens are changed uniformly by a factor α, the transmission coefficient profile remains substantially unchanged, but with the wavelength axis scaled by the factor α. In other words, when a planar lens has been designed with a particular transmission coefficient $T_0$ at a free space wavelength $\lambda_0$, a new planar lens with the same transmission coefficient at a different wavelength λ can be designed by multiplying the planar lens geometric parameters, such as the cavity length, line period spacing, line thickness, and line width, by the factor $\alpha=\lambda/\lambda_0$, giving $T(\lambda)=T_0(\lambda/\alpha)=T_0(\lambda_0)$.

In addition, a planar lens can be designed so that the planar lens has a $|T(\lambda)|\to 1$, but with a spatially varying phase and for a fixed resonator length, by scaling the parameters of the planar lens within the high-transmission spectral window 1716. Suppose that introducing a phase φ(x, y) to light transmitted through a point of a planar lens with transverse coordinates (x, y) is desired. Near the point (x, y) a nonuniform grating with a slowly varying scale factor α(x, y) behaves locally as though the planar lens was configured with a periodic grating with a transmission coefficient $T_0(\lambda/\alpha)$. Thus, for a planar lens with a certain resonator cavity length L and periodic grating design with a phase $\varphi_0$ at some wavelength $\lambda_0$, choosing a local scale factor $\alpha(x, y)=\lambda/\lambda_0$ gives $\varphi(x, y)=\varphi_0$ at the operating wavelength λ. For example, suppose that introducing a phase of approximately −0.2π on a portion of the light transmitted through a point (x, y) on a planar lens is desired, but current design of the planar lens introduces a phase of approximately −0.8π. Referring to the plot 1702, the desired phase $\varphi_0=-0.2\pi$ corresponds to the point 1722 on the curve 1714 and the wavelength $\lambda_0\approx 803$ nm 1725, and the phase −0.8π associated with the point (x, y) corresponds to the point 1726 on the curve 1714 and the wavelength $\lambda\approx 794$ nm. Thus the scale factor is $\alpha(x, y)=\lambda/\lambda_0=794/803=0.989$, and the geometric dimension of the planar lens, such as the cavity length L, the thickness of the slabs 1708 and 1710 t, the thickness, line period spacing, and line width of the grating 1706 at the point (x, y) can be adjusted by multiplying each of these parameters by the factor α in order to obtain the desired transmission phase $\varphi_0=-0.2\pi$ at the point (x, y) for the operating wavelength $\lambda\approx 794$ nm.

Figure 18:
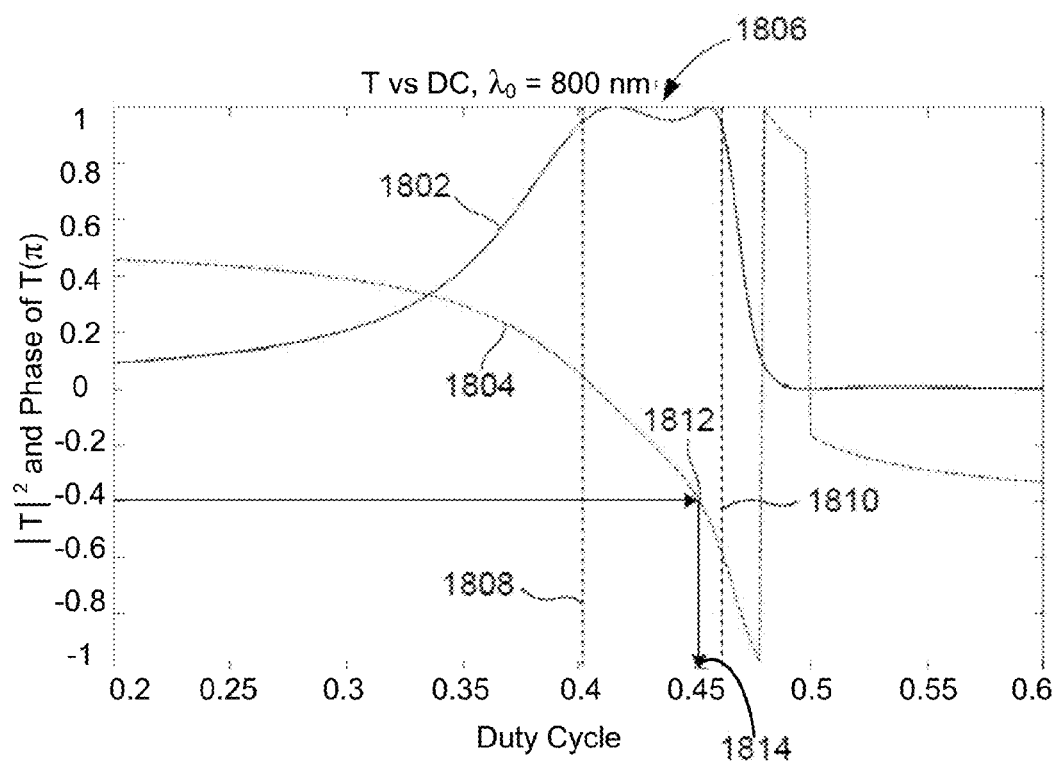
FIG. 18 shows a plot of transmittance and phase shift as a function of duty cycle for a sub-wavelength grating layer in accordance with one or more embodiments of the present invention.

The plot of transmittance and phase shift versus a range of wavelengths shown in FIG. 17 represents one way in which parameters of a planar lens can be selected in order to introduce a particular phase to light transmitted through a particular point of the planar lens. In certain embodiments, producing a desired phase variation in transmitted light through a planar lens can be accomplished by changing the duty cycle of the SWG layer without also adjusting the cavity length L and thickness t of the slabs. FIG. 18 shows a plot of transmittance and phase shift as a function of variations in the duty cycle of a SWG layer for light with a wavelength of approximately 800 nm. The planar lens is operated at normal incidence with the electric field polarized substantially perpendicular to the lines comprising the SWG layer. In FIG. 18, curve 1802 corresponds to the transmittance T(λ) and curve 1804 corresponds to the phase shift φ(λ) produced by the planar lens for the incident light with the wavelength of approximately 800 nm over a range of duty cycles from approximately 0.2π to approximately 0.6π. The transmittance and phase curves 1802 and 1804 can be determined using either MEEP or COMSOL Multiphysics®. Curve 1802 reveals a broad spectral region of high transmittance 1806. However, curve 1804 reveals that the phase of the transmitted light varies across the entire high transmittance region 1806 between dashed-lines 1808 and 1810 as a function of the duty cycle of the SWG layer. Thus, a planar lens can be operated to transmit light with the wavelength 800 nm, with a high transmittance 1806, and with a desired phase shift by configuring regions of the SWG layer with a duty cycle corresponding to the desired phase shift based on the curve 1804. For example, suppose that it is desired to transmit light through a particular region of the planar lens with a phase shift of −0.4π. A phase shift of −0.4π corresponds to a point 1812 on the curve 1804 and to a duty cycle of 0.451 (1814). Thus, in order to introduce the phase shift of −0.4π to light transmitted through this region, the corresponding region of the SWG layer alone can be configured with the duty cycle of 0.451 (1814).

Figure 19:
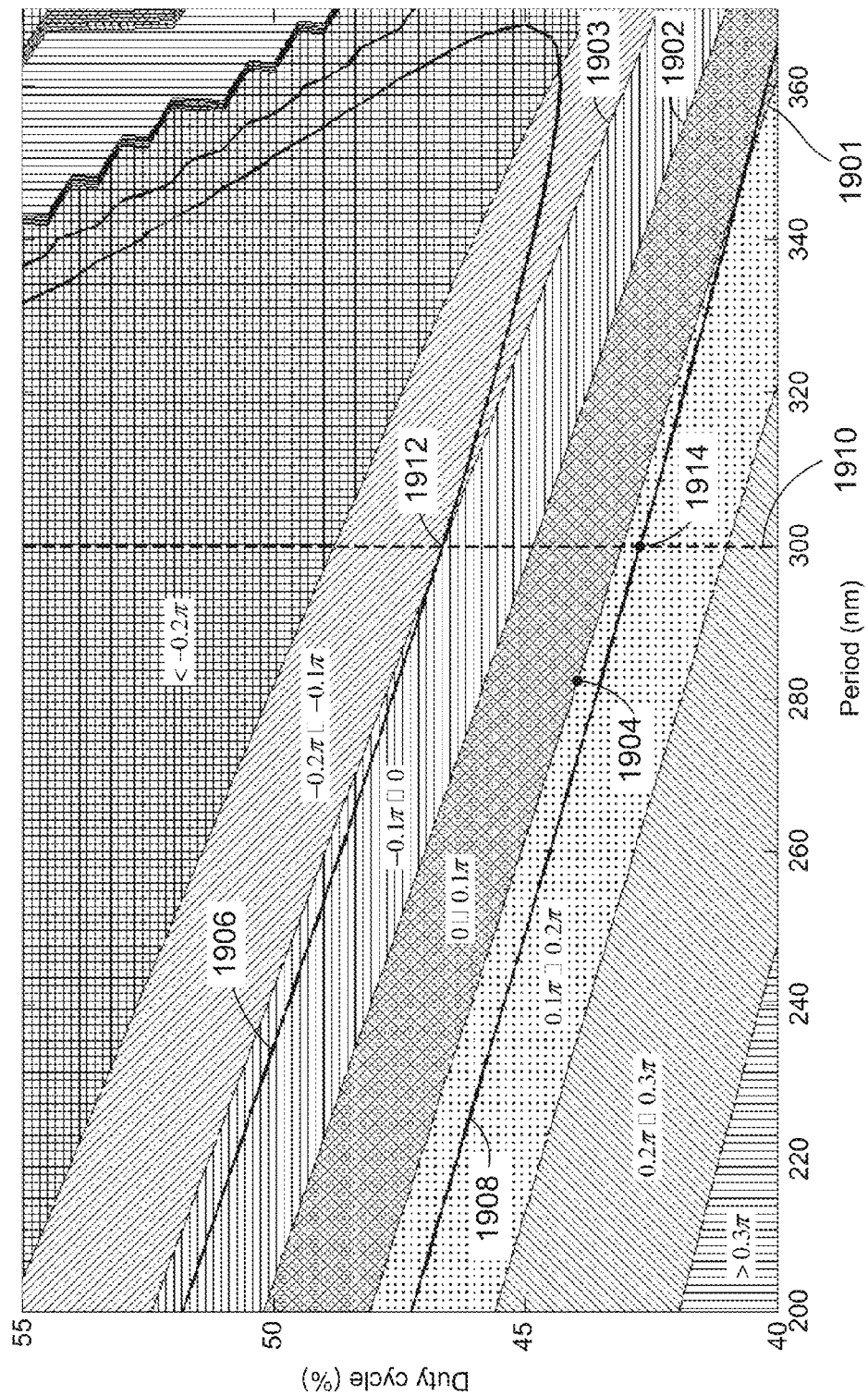
FIG. 19 shows a contour plot of phase shift variation as a function of period and duty cycle obtained in accordance with one or more embodiments of the present invention.

In still other embodiments, variations in the phase of light transmitted through a planar lens can be accomplished as a function of line period spacing and duty cycle of the SWG layer of the planar lens without adjusting the cavity length L and slab thickness t. FIG. 19 shows a contour plot of phase variation as a function of period and duty cycle obtained in accordance with embodiments of the present invention using either MEEP or COMSOL Multiphysics®. Contour lines, such as contour lines 1901-1903, each correspond to a particular phase acquired by light transmitted through a planar lens with the SWG layer configured with a period and duty cycle lying anywhere along the contour. The phase contours are separated by 0.1π rad. For example, contour 1901 corresponds to periods and duty cycles that apply a phase of 0.1π rad to transmitted light. Phases between 0.1π rad and 0.0 rad are applied to light transmitted through a region of a planar lens where the SWG layer has periods and duty cycles that lie between contours 1901 and 1902. A point (p, η) 1904 corresponds to a grating period of 280 nm and 44% duty cycle. A sub-region of the SWG layer with a period and duty cycle corresponding to the point 1904 introduces the phase φ=0.1π rad to light transmitted through the sub-region of the planar lens. FIG. 19 also includes two transmission contours 1906 and 1908 for 95% transmission overlain on the phase contour surface. Points (p, η, φ) that lie anywhere between the contours 1906 and 1908 have a minimum transmission of 95%.

The points (p, η, φ) represented by the phase contour plot can be used to select periods and duty cycles for a SWG layer of a planar lens that can be operated as a particular type of lens with a minimum transmission, as described below in the next subsection. In other words, the data represented in the phase contour plot of FIG. 19 can be used to configure the grating sub-patterns of a SWG layer of a planar lens. In certain embodiments, the period or duty cycle can be fixed while the other parameter is varied to configure the SWG layer. In other embodiments, both the period and duty cycle can be varied to configure the SWG layer.

Figure 20:
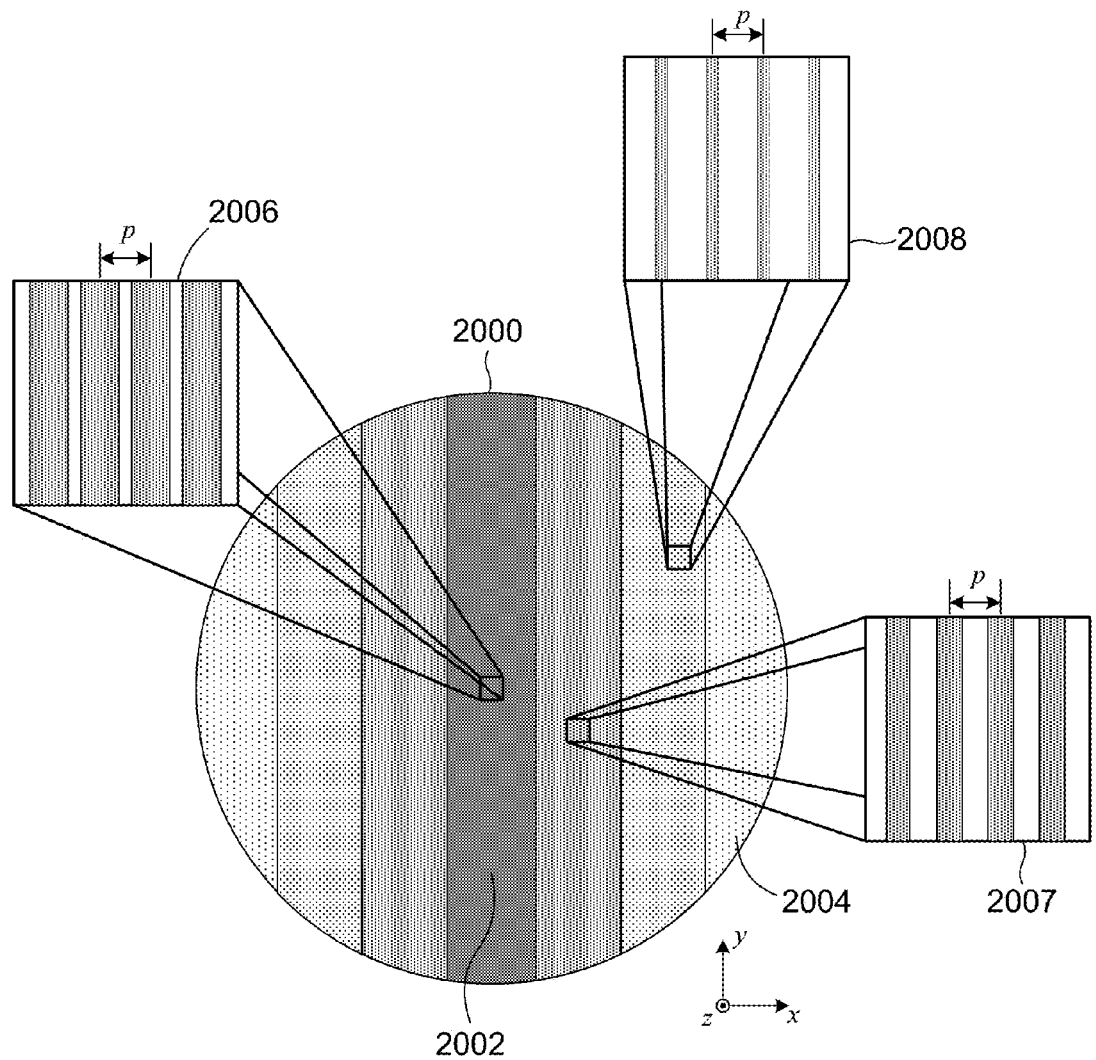
FIG. 20 shows a top plan view of a non-periodic, sub-wavelength grating configured to operate as a convex lens for polarized incident light in accordance with one or more embodiments of the present invention.

In certain embodiments, the SWG layer can be configured so that the planar lens can be operated as a convex lens. In the following example, changes in the duty cycle are achieved by varying the line width of the NP-SWG while holding the period constant. FIG. 20 shows a top plan-view of a SWG layer 2000 with a one-dimensional grating configured so that a planar lens can be operated as a convex lens for incident light polarized substantially parallel to the x-direction in accordance with one or more embodiments of the present invention. Each shaded region of the NP-SWG represents a different grating sub-pattern of lines extending in the y-direction, with darker shaded regions, such as region 2002, representing regions with a relatively larger duty cycle than lighter shaded regions, such as region 2004. FIG. 20 includes enlargements 2006-2008 of three sub-regions revealing that the lines run parallel in the y-direction and the line period spacing p is constant or fixed in the x-direction.

Enlargements 2006-2008 also reveal that the line width w, in other words the duty cycle η, decreases away from the center in the x-direction. The SWG layer 2000 is configured so that light of an appropriate wavelength and polarized in the x-direction (i.e., single mode) is transmitted through the planar lens and is focused at a focal point.

Figure 21:
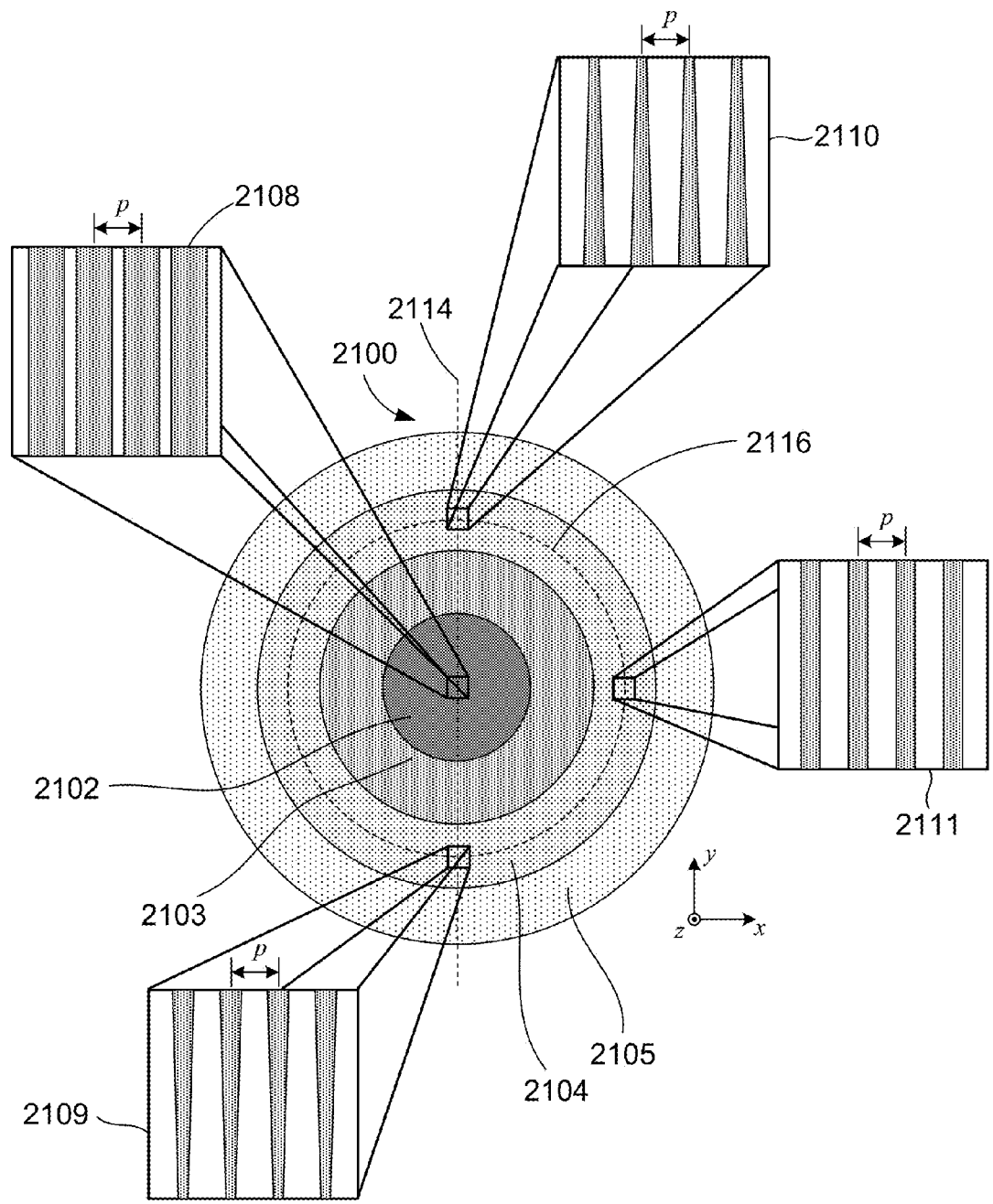
FIG. 21 shows a top plan view of a non-periodic, sub-wavelength grating configured to operate as a convex lens for non-polarized incident light in accordance with one or more embodiments of the present invention.

In certain embodiments, the SWG layer can be configured so that the planar lens can be operated as a convex lens for focusing incident light polarized in any direction by appropriately tapering the lines of the NP-SWG away from the center of the SWG-layer. FIG. 21 shows a top plan view of a one-dimensional grating pattern of a SWG layer 2100 configured so that a planar lens can be operated as a convex lens for incident light polarized in any direction in accordance with one or more embodiments of the present invention. The SWG layer 2100 includes a NP-SWG with a grating pattern represented by annular shaded regions 2102-2105. Each shaded annular region represents a different grating sub-pattern of lines. Enlargements 2108-2111 show that the NP-SWG comprises lines tapered in the y-direction with a constant line period spacing p in the x-direction. In particular, enlargements 2108-2110 are enlargements of the same lines running parallel to dashed-line 2114 in the y-direction. Enlargements 2108-2110 reveal that the line period spacing p remains constant but the width of the lines narrow or taper away from the center of the NP-SWG in the y-direction. Each annular region has the same duty cycle and period. For example, enlargements 2109-2111 reveal portions of the annular region 2104 comprising portions of different lines that have substantially the same duty cycle. As a result, each portion of an annular region produces the same approximate phase shift in the light transmitted through the planar lens. For example, dashed circle 2116 represents a single phase shift contour in which light transmitted through the planar lens anywhere along the circle 2116 acquires substantially the same phase φ.

Figure 22:
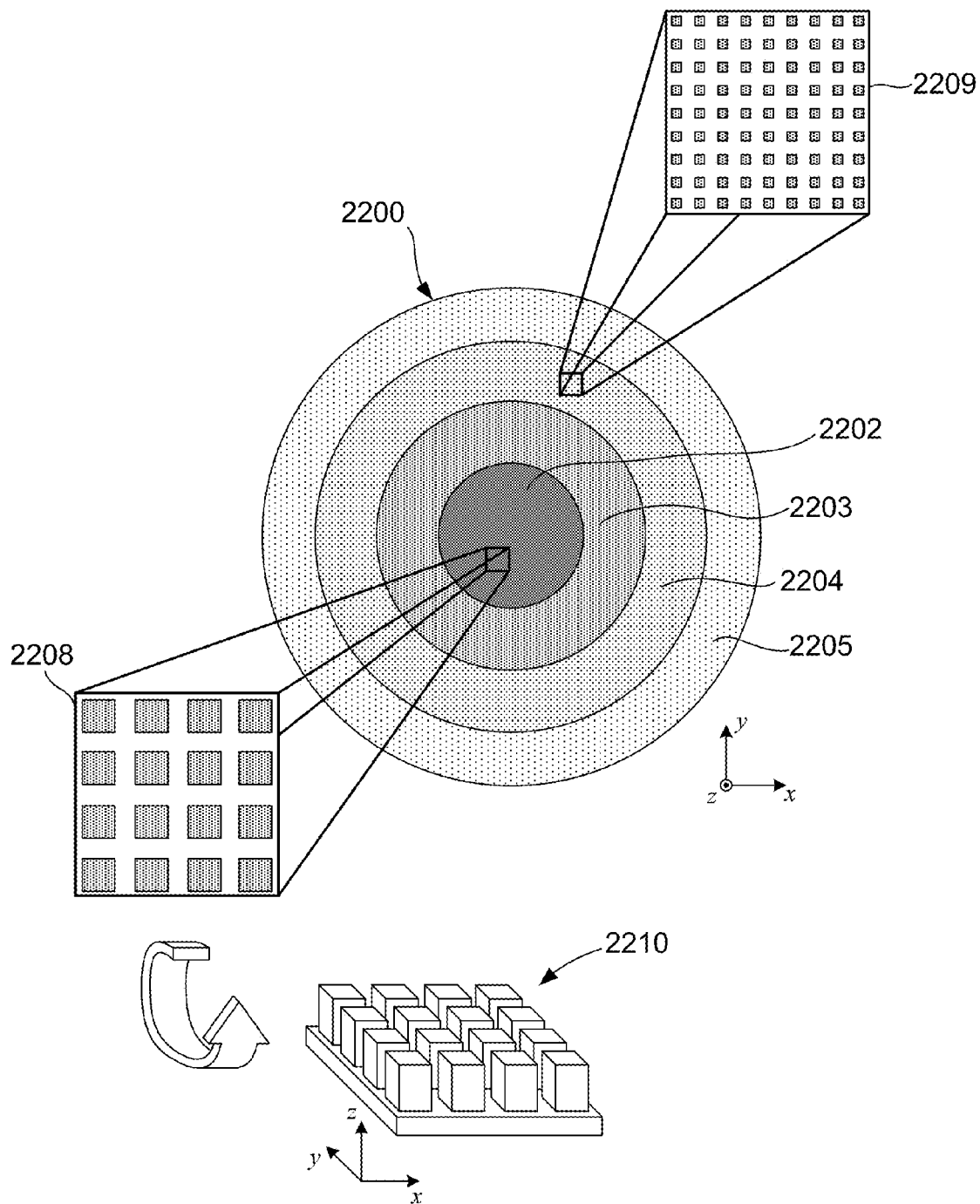
FIGS. 22-23 show top plan views of example two-dimensional grating patterns of a non-periodic, sub-wavelength grating layer configured in accordance with one or more embodiments of the present invention.
Figure 23:
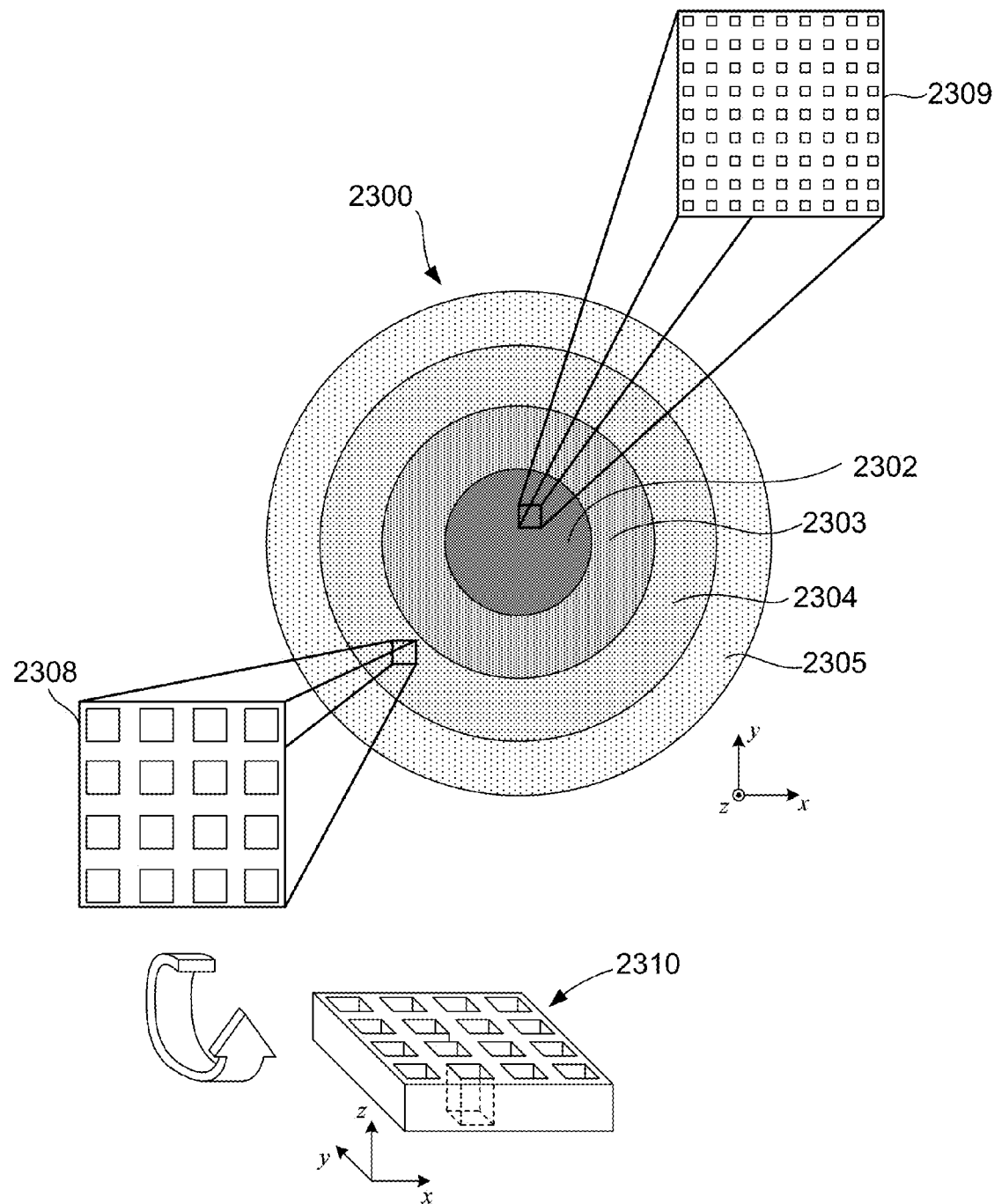

Embodiments of the present invention are not limited to one-dimensional gratings. The SWG layer can be configured with a two-dimensional NP-SWG so that the planar lens can be operated as a convex or concave lens. FIGS. 22 and 23 show top plan views of two examples of two-dimensional grating patterns configured so that a planar lens can be operated as a convex lens for incident unpolarized light in accordance with one or more embodiments of the present invention. In the example of FIG. 22, the NP-SWG is composed of posts rather lines separated by grooves. The duty cycle and period can be varied in the x- and y-directions. The SWG layer 2200 includes a NP-SWG with a grating pattern represented by annular shaded regions 2202-2205. Each shaded annular region represents a different grating sub-pattern of posts. Enlargements 2208 and 2209 show two different post sizes, where the size of the posts decreases away from the center of the NP-SWG. FIG. 22 includes an isometric view 2210 of posts comprising the enlargement 1508. The posts can be square, rectangular, circular, elliptical, or any other suitable shape. In the example of FIG. 23, the NP-SWG is composed of holes rather posts. The SWG layer 1520 includes a NP-SWG with a grating pattern also represented by annular shaded regions 2302-2305. Each shaded annular region represents a different grating sub-pattern of holes. Enlargements 2308 and 2309 show two different hole sizes, where the size of the holes increases away from the center of the NP-SWG. FIG. 23 includes an isometric view 2310 of holes comprising the enlargement 2308. Although the holes shown in FIG. 23 are square shaped, in other embodiments, the holes can be rectangular, circular, elliptical, or any other suitable shape.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated.

It is intended that the scope of the invention be defined by the following claims and their equivalents:

1. An optical device comprising a plurality of planar lenses that are each arranged parallel with respect to each other and orthogonally along an intersecting optical axis, each of the plurality of planar lenses comprising a non-periodic, sub-wavelength grating layer that is to provide one of convergence and divergence with respect to light that propagates through the optical device along the optical axis wherein one of the plurality of planar lenses comprises: a first planar non-periodic, sub-wavelength grating layer; and a second planar non-periodic, sub-wavelength grating layer arranged adjacent with the first planar non-periodic, sub-wavelength grating layer and a second dielectric layer extending between the second reflective layer and the non-periodic, sub-wavelength grating layer along the optical axis, wherein the second reflective layer and the non-periodic, sub-wavelength grating layer form a second resonant cavity with respect to the light propagating through the optical device along the optical axis.

2. The optical device of claim 1, further comprising a dielectric layer having a refractive index that is less than a refractive index associated with each of the plurality of planar lenses, the dielectric layer being arranged in contact with and between each of the plurality of planar lenses.

3. The optical device of claim 1, wherein the first planar non-periodic, sub-wavelength grating layer is to operate as a biconvex lens with respect to the light that propagates through the optical device, and wherein the second planar non-periodic, sub-wavelength grating layer is to operate as a planoconvex lens with respect to the light that propagates through the optical device.

4. The optical device of claim 1, wherein the one of the plurality of planar lenses further comprises a third planar non-periodic, sub-wavelength grating layer that is arranged adjacent with the second planar non-periodic, sub-wavelength layer opposite the first planar non-periodic, sub-wavelength layer.

5. The optical device of claim 1, wherein one of the plurality of planar lenses comprises an aperture to collimate the light that propagates along the optical path.

6. The optical device of claim 1, wherein one of the plurality of planar lenses comprises:
 a reflective layer;
 a non-periodic, sub-wavelength grating layer; and
 a dielectric layer extending between the reflective layer and the non-periodic, sub-wavelength grating layer along the optical axis, wherein the reflective layer and the non-periodic, sub-wavelength grating layer form a resonant cavity with respect to the light propagating through the optical device along the optical axis.

7. The optical device of claim 1, wherein the non-periodic, sub-wavelength grating layer associated with at least one of the plurality of lenses comprises a one-dimensional non-periodic grating pattern.

8. The optical device of claim 7, wherein the one-dimensional non-periodic grating pattern comprises substantially parallel lines separate by grooves.

9. The optical device of claim 8, wherein at least a portion of the substantially parallel lines comprise tapered lines separate by the grooves.

10. The optical device of claim 1, wherein the non-periodic, sub-wavelength grating layer comprises a plurality of grating sub-patterns, wherein each of the plurality of grating sub-patterns comprises a grating dimension and a grating period that is not equal with respect to other grating sub-patterns of the plurality of grating sub-patterns.

11. The optical device of claim 10, wherein the plurality of grating sub-patterns are arranged as a circular portion centered with respect to the optical axis and a concentric ring with respect to the optical axis.

12. The optical device of claim 10, wherein a respective one of the plurality of grating sub-patterns comprises tapered lines separate by grooves along a surface of a respective one of the plurality of planar lenses, wherein the tapered lines are tapered to have a smaller line-width extending away from the optical axis.

13. The optical device of claim 10, wherein each of the plurality of grating sub-patterns comprises a two-dimensional non-periodic grating pattern.

14. A lens array comprising:
a substrate;
an array of photosensors embedded within the substrate; and
an array of optical devices, each of the optical devices being coupled to a corresponding photosensor of the array of photosensors and comprising a plurality of planar lenses that are each arranged parallel with respect to each other and orthogonally along an intersecting optical axis to direct and refract incident light along the optical axis onto the corresponding photosensor wherein one of the plurality of planar lenses comprises: a first planar non-periodic, sub-wavelength grating layer; and a second planar non-periodic, sub-wavelength grating layer arranged adjacent with the first planar non-periodic, sub-wavelength grating layer and a second dielectric layer extending between the second reflective layer and the non-periodic, sub-wavelength grating layer along the optical axis, wherein the second reflective layer and the non-periodic, sub-wavelength grating layer form a second resonant cavity with respect to the light propagating through the optical device along the optical axis.

15. The lens array of claim 14, wherein one of the plurality of planar lenses associated with an optical device of the array of optical devices comprises:
a first planar non-periodic, sub-wavelength grating layer; and
a second planar non-periodic, sub-wavelength grating layer arranged adjacent with the first planar non-periodic, sub-wavelength grating layer.

16. The lens array of claim 14, wherein one of the plurality of planar lenses associated with an optical device of the array of optical devices comprises:
a reflective layer;
a non-periodic, sub-wavelength grating layer; and
a dielectric layer extending between the reflective layer and the non-periodic, sub-wavelength grating layer along the optical axis, wherein the reflective layer and the non-periodic, sub-wavelength grating layer form a resonant cavity with respect to the light propagating through the optical device along the optical axis.

17. The lens array of claim 14, wherein one of the plurality of planar lenses associated with an optical device of the array of optical devices comprises a non-periodic, sub-wavelength grating layer comprising a plurality of grating sub-patterns, wherein each of the plurality of grating sub-patterns comprises a grating dimension and a grating period that is not equal with respect to other grating sub-patterns of the plurality of grating sub-patterns.

18. The lens array of claim 14, wherein the substrate comprises a substantially hemispherical shape.

* * * * *